US010734959B2

(12) United States Patent
Yoneda et al.

(10) Patent No.: US 10,734,959 B2
(45) Date of Patent: Aug. 4, 2020

(54) SOUND PROCESSING DEVICE AND METHOD TO SUPPRESS AN EXCESSIVE AMPLITUDE

(71) Applicant: SONY CORPORATION, Tokyo (JP)

(72) Inventors: Michiaki Yoneda, Kanagawa (JP); Yoshiyuki Kuroda, Chiba (JP); Masaki Kamata, Tokyo (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/463,146

(22) PCT Filed: Dec. 8, 2017

(86) PCT No.: PCT/JP2017/044110
§ 371 (c)(1),
(2) Date: May 22, 2019

(87) PCT Pub. No.: WO2018/116861
PCT Pub. Date: Jun. 28, 2018

(65) Prior Publication Data
US 2019/0305741 A1 Oct. 3, 2019

(30) Foreign Application Priority Data

Dec. 22, 2016 (JP) .................................. 2016-248798

(51) Int. Cl.
*H04R 3/00* (2006.01)
*H03G 3/30* (2006.01)

(52) U.S. Cl.
CPC ............. *H03G 3/3005* (2013.01); *H04R 3/00* (2013.01); *H04R 3/007* (2013.01); *H03G 2201/70* (2013.01); *H03G 2201/708* (2013.01)

(58) Field of Classification Search
CPC ......... H03G 2201/70; H03G 2201/708; H03G 3/3005; H04R 3/00; H04R 3/007; H04R 1/22; H04R 1/2873
(Continued)

(56) References Cited

U.S. PATENT DOCUMENTS 9,930,449 B2 * 3/2018 Mendes .................... H04R 3/04
2009/0268918 A1 * 10/2009 Solgaard ................ H03G 9/005
381/55
(Continued)

FOREIGN PATENT DOCUMENTS

CN 103369447 A 10/2013
CN 104811154 A 7/2015
(Continued)

OTHER PUBLICATIONS

International Search Report and Written Opinion of PCT Application No. PCT/JP2017/044110, dated Feb. 27, 2018, 11 pages of ISRWO.

*Primary Examiner* — Vivian C Chin
*Assistant Examiner* — Friedrich Fahnert
(74) *Attorney, Agent, or Firm* — Chip Law Group

(57) ABSTRACT

The present technology relates to a sound processing device, a method, and a program capable of suppressing an excessive amplitude and obtaining higher quality of sound. A sound processing device includes: a prediction value calculation unit that calculates a prediction value of a displacement of a speaker according to an input signal supplied to the speaker on the basis of an equivalent model of the speaker; and an amplitude control unit that performs amplitude control on the input signal in a case in which the prediction value is greater than a predetermined threshold value. The present technology can be applied to a sound reproduction system.

10 Claims, 18 Drawing Sheets

(58) Field of Classification Search
USPC .................................... 381/55, 58, 59, 107
See application file for complete search history.

(56) References Cited

U.S. PATENT DOCUMENTS

| | | |
|---|---|---|
| 2011/0228945 A1 | 9/2011 | Mihelich et al. |
| 2013/0259245 A1 | 10/2013 | Cheng et al. |
| 2014/0254804 A1 | 9/2014 | Su |
| 2014/0348336 A1 | 11/2014 | Tong et al. |
| 2015/0010168 A1 | 1/2015 | Cheng et al. |
| 2016/0014507 A1 | 1/2016 | Su |
| 2016/0241960 A1 | 8/2016 | Cheng et al. |
| 2018/0091911 A1* | 3/2018 | Parupalli ................ H04R 3/007 |

FOREIGN PATENT DOCUMENTS

| | | |
|---|---|---|
| CN | 105302287 A | 2/2016 |
| CN | 107317559 A | 11/2017 |
| EP | 2645740 A1 | 10/2013 |
| EP | 2899883 A1 | 7/2015 |
| EP | 2966879 A1 | 1/2016 |
| EP | 3240302 A1 | 11/2017 |
| JP | 2013-055676 A | 3/2013 |
| JP | 2015-126444 A | 7/2015 |
| TW | 201340732 A | 10/2013 |
| TW | 201531112 A | 8/2015 |
| TW | 201603596 A | 1/2016 |

* cited by examiner

FIG. 10
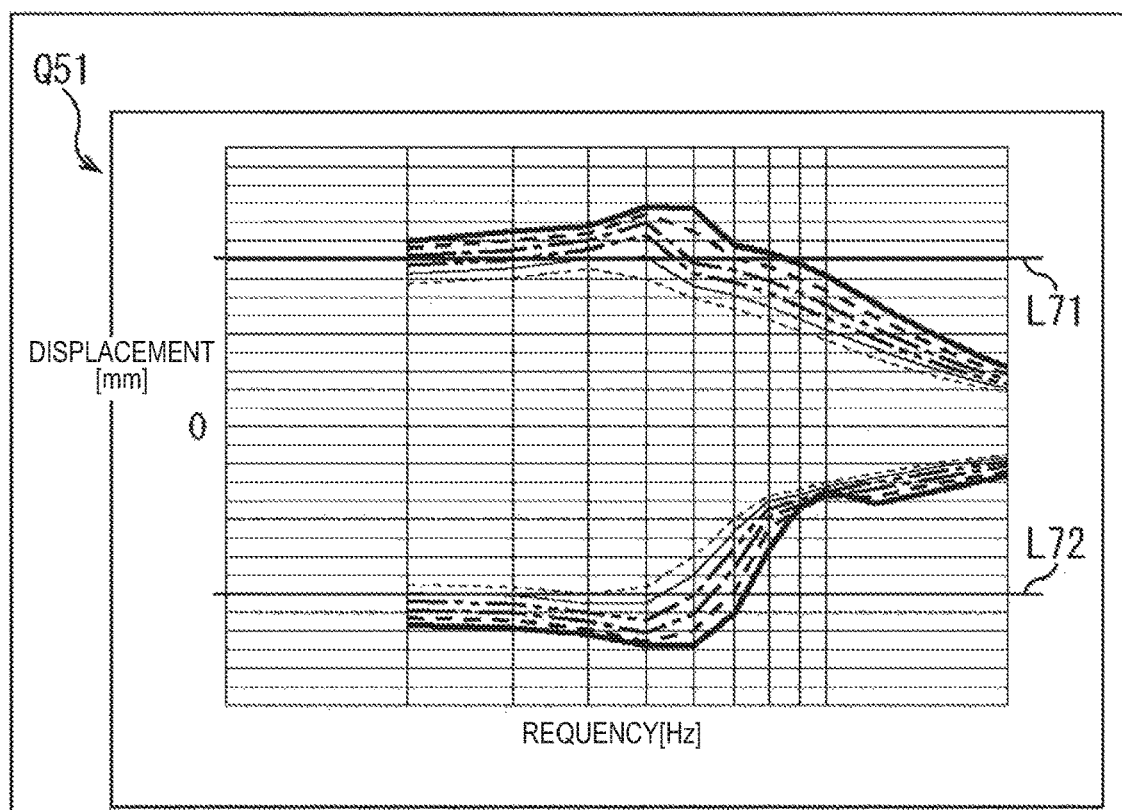
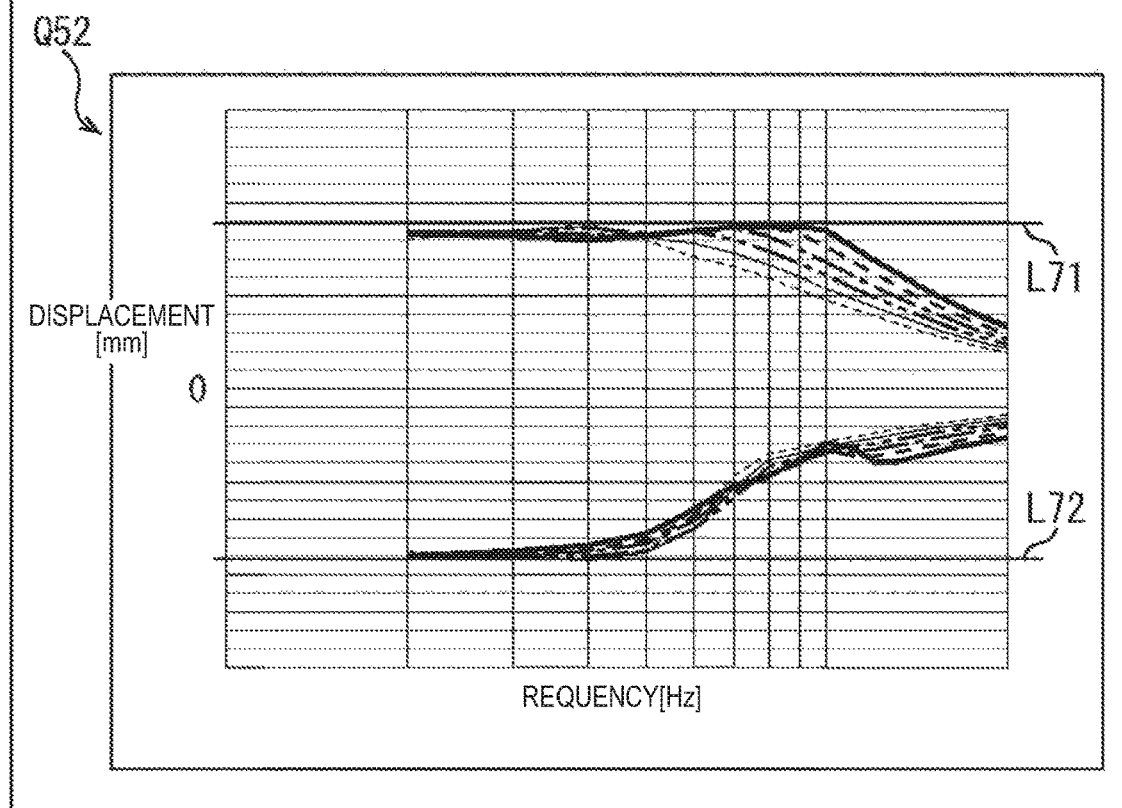

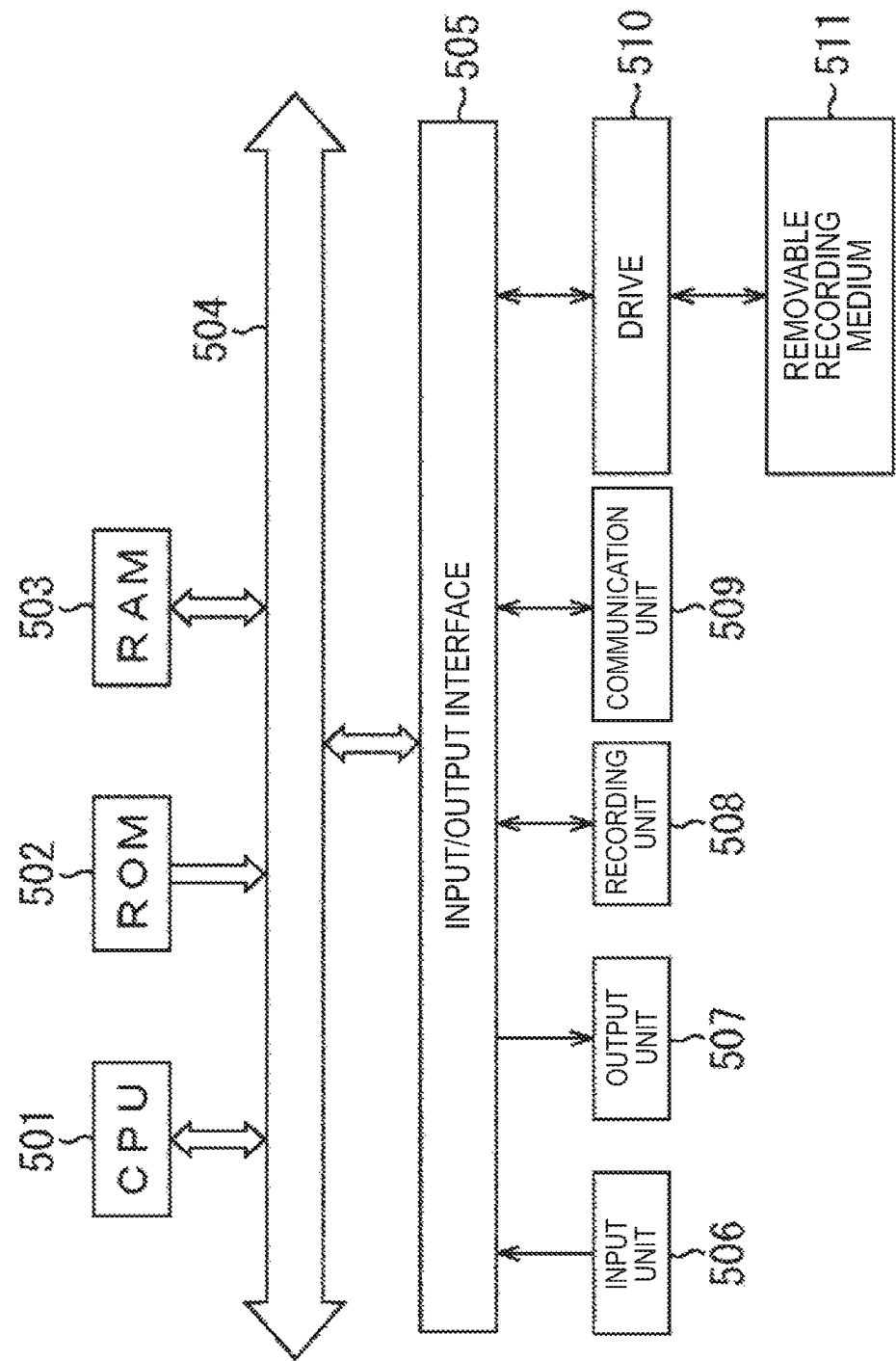

SOUND PROCESSING DEVICE AND METHOD TO SUPPRESS AN EXCESSIVE AMPLITUDE

CROSS REFERENCE TO RELATED APPLICATIONS

This application is a U.S. National Phase of International Patent Application No. PCT/JP2017/044110 filed on Dec. 8, 2017, which claims priority benefit of Japanese Patent Application No. JP 2016-248798 filed in the Japan Patent Office on Dec. 22, 2016. Each of the above-referenced applications is hereby incorporated herein by reference in its entirety.

TECHNICAL FIELD

The present technology relates to a sound processing device, a method, and a program, and in particular, to a sound processing device, a method, and a program capable of suppressing an excessive amplitude and obtaining higher quality of sound.

BACKGROUND ART

In the related art, many technologies for improving the quality of sound output from a speaker have been proposed. For example, as such a technology, a technology for detecting an impedance of a speaker, forming sound information of a frequency characteristic corresponding to a detection result, and supplying the sound information to the speaker so that a sound output of a stable frequency characteristic is able to be obtained has been proposed (refer to, for example, Patent Literature 1).

CITATION LIST

Patent Literature

Patent Literature 1: JP 2015-126444A

DISCLOSURE OF INVENTION

Technical Problem

Meanwhile, in a case in which an excessive amplitude occurs in a speaker, inter modulation (IM) distortion (cross modulation distortion) in which a signal of a high frequency band is lost occurs. Therefore, in a case in which there is a sound in a frequency band where an excessive amplitude occurs, reproduced voice or the like shakes and quality of sound is reduced.

The present technology has been made in view of such a situation, and is intended to suppress an excessive amplitude and to obtain higher quality of sound.

Solution to Problem

A sound processing device according to an aspect of the present technology includes: a prediction value calculation unit that calculates a prediction value of a displacement of a speaker according to an input signal supplied to the speaker on the basis of an equivalent model of the speaker; and an amplitude control unit that performs amplitude control on the input signal in a case in which the prediction value is greater than a predetermined threshold value.

The prediction value calculation unit can be caused to correct a parameter of the equivalent model according to an actual measurement value of a current flowing through the speaker.

The prediction value calculation unit can be caused to correct mechanical system compliance as the parameter.

The prediction value calculation unit can be caused to correct a direct current resistance of a voice coil of the speaker as the parameter.

The sound processing device can further include: a temperature calculation unit that calculates a temperature of the voice coil on the basis of the direct current resistance; and a temperature control unit that performs temperature control for suppressing a temperature increase of the voice coil with respect to the input signal according to the temperature of the voice coil.

The sound processing device can further include: a displacement calculation unit that calculates the displacement of the speaker on the basis of an actual measurement value of a current flowing through the speaker. In a case in which a larger one of the displacement calculated by the displacement calculation unit and the prediction value is greater than the threshold value, the amplitude control unit can be caused to perform amplitude control on the input signal.

The sound processing device can further include: a delay unit that delays the input signal by a predetermined time and supplies the delayed signal to the amplitude control unit.

The prediction value calculation unit can be caused to calculate the prediction value on the basis of the equivalent model determined by a plurality of parameters including a force coefficient that changes nonlinearly with respect to the displacement of the speaker and mechanical system compliance.

The amplitude control unit can be caused to perform amplitude control on the input signal on the basis of a gain value determined from the prediction value and the threshold value.

A sound processing method or a program according to an aspect of the present technology includes the steps of: calculating a prediction value of a displacement of a speaker according to an input signal supplied to the speaker on the basis of an equivalent model of the speaker; and performing amplitude control on the input signal in a case in which the prediction value is greater than a predetermined threshold value.

According to an aspect of the present technology, a prediction value of a displacement of a speaker according to an input signal supplied to the speaker is calculated on the basis of an equivalent model of the speaker; and amplitude control is performed on the input signal in a case in which the prediction value is greater than a predetermined threshold value.

Advantageous Effects of Invention

According to an aspect of the present technology, it is possible to suppress an excessive amplitude and obtain higher quality of sound.

Note that the advantageous effects described here are not necessarily limitative, and any of the advantageous effects described in the present disclosure may be attained.

BRIEF DESCRIPTION OF DRAWINGS

FIG. 10 is a diagram for explaining on and off of the excessive amplitude suppression control.

FIG. 18 is a diagram showing a configuration example of a computer.

MODE(S) FOR CARRYING OUT THE INVENTION

Figure 1:
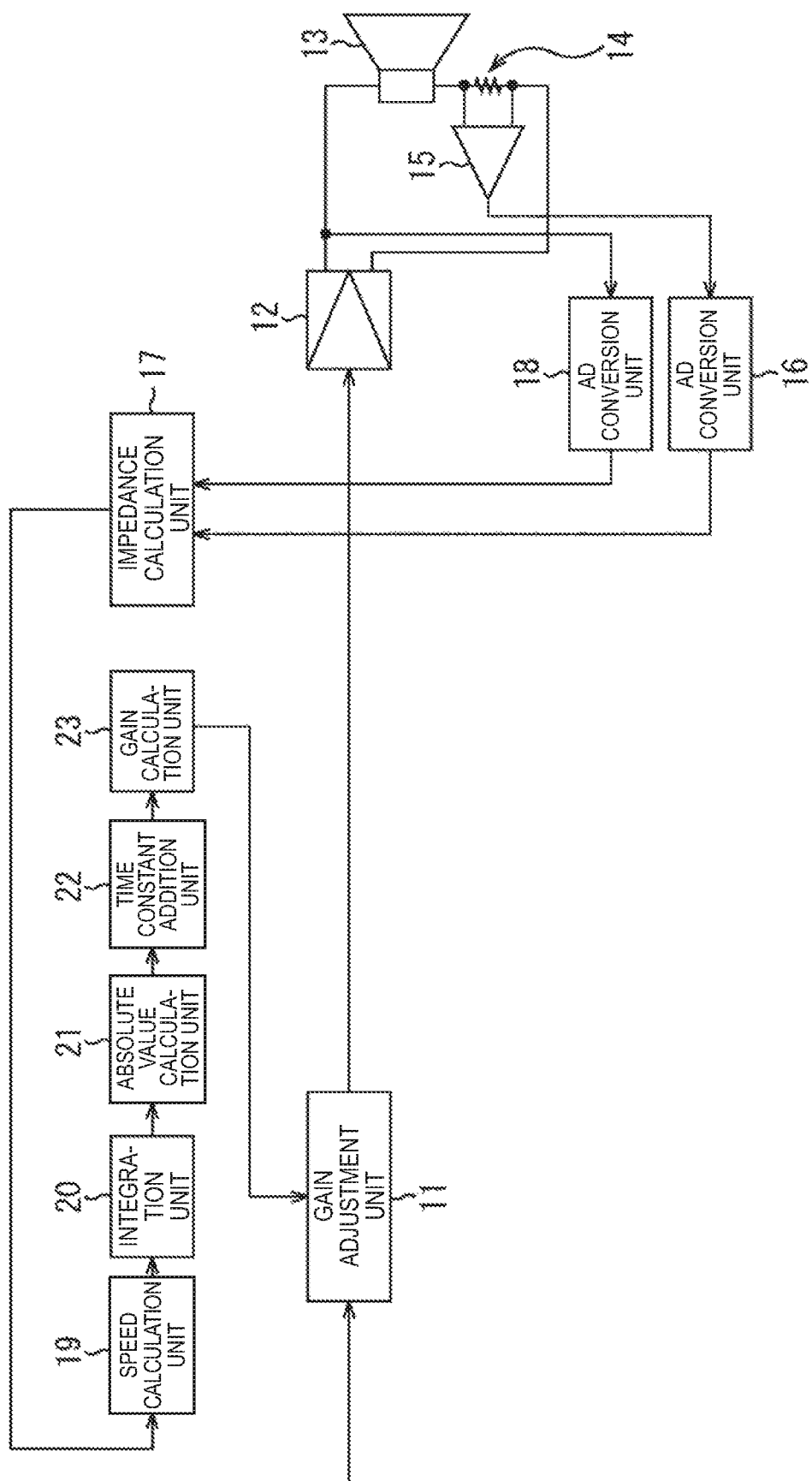
FIG. 1 is a diagram for explaining a sound reproduction system.

Hereinafter, an embodiment to which the present technology is applied will be described with reference to the drawings.

First Embodiment

<About the Present Technology>

For example, the present technology is able to be applied to a sound reproduction device that connects a speaker for reproducing music of high resolution (high resolution), or the like.

For example, a phenomenon in which, in a case in which a speaker causes an excessive amplitude and thus a voice coil comes out of a magnetic circuit, a force coefficient approaches 0, a signal of a current flowing through the voice coil is not transmitted to a diaphragm, and a signal of a high frequency band is lost is known, and this phenomenon is called IM distortion.

In a case in which the IM distortion occurs, for example, in a case in which there is a sound of a frequency band where an excessive amplitude of a bass drum or the like occurs, when the sound is reproduced with the speaker, the reproduced sound shakes. That is, quality of the sound is reduced.

In addition, even in high resolution music and the like, there have been cases in which a signal of a high frequency band is sometimes left out due to an excessive amplitude of the speaker, despite being in a wide band and a wide range.

Therefore, in a general sound reproduction device, a method of cutting a frequency band where a signal is excessively amplified by a high pass filter (HPF) is used as a method of preventing voice or the like from shaking. However, in this method, a sound pressure in a low frequency band is reduced regardless of a sound pressure level.

In addition, as a method of preventing voice or the like from shaking, a method of inserting detection resistors into the speaker in series to acquire a signal proportional to a current from a voltage at both ends of the detection resistor and suppressing an excessive amplitude using the acquired signal (hereinafter also referred to as an actual measurement suppression method) is considered.

In the actual measurement suppression method, an impedance is calculated from the signal proportional to the acquired current and the voltage applied to the speaker, a speed of the speaker is calculated from the impedance, and a displacement value of the speaker is calculated by further integrating the speed. In addition, control for suppressing the excessive amplitude of the speaker is performed on the basis of the obtained displacement value of the speaker.

However, in this method, since there is a transient response time until a signal is applied to the speaker and the speaker starts to move at a frequency in the vicinity of the resonance frequency, even though suppression control is started after the displacement value of the speaker exceeds the threshold value of the excessive amplitude, control is not able to keep up with a movement of the speaker.

Here, the actual measurement suppression method will be described in more detail. For example, the actual measurement suppression method is able to be realized by a configuration shown in FIG. 1.

In a sound reproduction system shown in FIG. 1, a source signal of a sound to be reproduced, that is, a sound signal, is supplied as an input signal to a gain adjustment unit 11, and gain adjustment is performed. In addition, the input signal on which the gain adjustment is performed is supplied to the speaker 13 via the amplifier 12, and a sound based on the input signal is output from the speaker 13.

In addition, in the sound reproduction system, a detection resistor 14 is connected in series to the speaker 13 in order to detect the excessive amplitude of the speaker 13.

In addition, a current flowing through the detection resistor 14 is measured by a differential amplifier 15, and the measurement result is converted into a digital value by an analog digital (AD) conversion unit 16 and supplied to an impedance calculation unit 17.

Furthermore, a voltage value of an output of the amplifier 12, that is, a value of the voltage applied to the speaker 13 is converted into a digital value by an AD conversion unit 18 connected to an output terminal of the amplifier 12 and supplied to the impedance calculation unit 17.

In the impedance calculation unit 17, an impedance is calculated from the actual measurement value of the current supplied from the AD conversion unit 16 and the actual measurement value of the voltage supplied from the AD conversion unit 18 and is supplied to a speed calculation unit 19. Furthermore, a speed is calculated from the impedance in the speed calculation unit 19, the speed is integrated in an integration unit 20, and thus the displacement value of the speaker 13 is calculated, and an absolute value of the displacement value of the speaker 13 is calculated by an absolute value calculation unit 21.

Thereafter, a time constant is added to the absolute value of the displacement value by a time constant addition unit 22 and is supplied to a gain calculation unit 23. In a case in which the absolute value of the displacement value of the speaker 13 exceeds a threshold value of the excessive amplitude, the gain calculation unit 23 determines a gain value so that a frequency component where the signal applied to the speaker 13 is excessively amplified is suppressed, and the gain is supplied to the gain adjustment unit 11.

In addition, in the gain adjustment unit 11, gain adjustment is performed on the supplied input signal using a filter coefficient determined by the gain value supplied from the gain calculation unit 23.

The advantage of such an actual measurement suppression method is that, since the current flowing through the actual speaker 13 is measured, it is possible to ascertain a characteristic of the speaker 13 at that time, and it is possible to follow individual variation and aging of the speaker 13.

Figure 2:
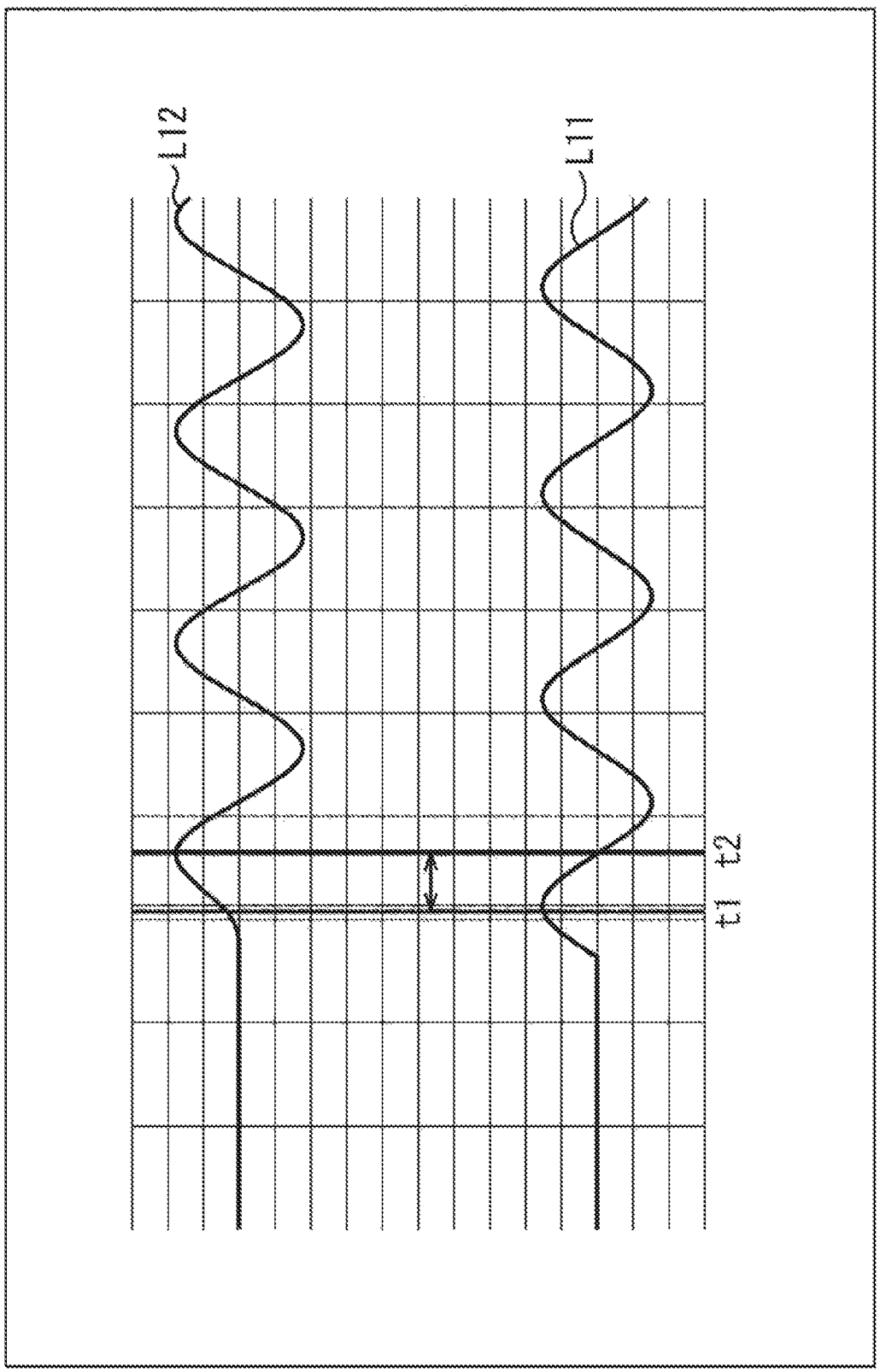
FIG. 2 is a diagram for explaining a delay during excessive amplitude suppression control.

On the other hand, in the measurement suppression method, for example, as shown in FIG. 2, since there is a delay at the start of movement of the speaker 13, there is a disadvantage that when the excessive amplitude occurs, it is impossible to perform the suppression control in an initial part of the excessive amplitude, that is, a portion where the excessive amplitude starts to occur.

Note that, in FIG. 2, a horizontal axis represents time and a vertical axis represents level. In FIG. 2, a curve L11 shows the input signal supplied from the amplifier 12 to the speaker 13, that is, an analog voltage signal, and a curve L12 shows the actual displacement of the speaker 13.

From these curves L11 and L12, it can be seen that there is a delay from when the input signal is supplied to the speaker 13 until the speaker 13 actually moves.

For example, in the curve L12, a time at which the displacement of the actual speaker 13 becomes a displacement corresponding to a level at a time t1 of the input signal shown by the curve L11 is a time t2 and a delay occurs for a period between such times.

In the sound reproduction system shown in FIG. 1, since the current flowing through the detection resistor 14 connected to the speaker 13 in series is actually measured, a timing at which the displacement value of the excessive amplitude is detected by the gain calculation unit 23 is substantially the same as that of the actual displacement of the speaker 13 shown by the curve L12.

Therefore, for example, even though the excessive amplitude is detected at the time t2, it is impossible to perform a process of suppressing the excessive amplitude with respect to the period between the time t1 and the time t2 in the input signal. Therefore, when the excessive amplitude occurs in the speaker 13, a delay may always occur from the occurrence of the excessive amplitude until the start of the process of suppressing the excessive amplitude, and it has been impossible to suppress the excessive amplitude in a portion immediately after the occurrence of the excessive amplitude. Therefore, as described above, the signal of the high frequency band is lost due to the IM distortion.

As described above, it has been difficult to sufficiently suppress the excessive amplitude even though the control for suppressing the excessive amplitude is performed by the actual measurement suppression method.

Therefore, in the present technology, for example, a prediction value of the displacement value of the speaker is calculated by feed forward using a speaker equivalent model on the basis of a source signal that is a sound signal for reproducing the sound, and in a case in which the prediction value exceeds a threshold value of the excessive amplitude, control for suppressing the excessive amplitude is performed. In particular, in the present technology, control is performed by delaying the source signal by the delay time at the time of a speaker operation.

Therefore, more accurately suppression control of the excessive amplitude of the speaker is possible, and it is possible to suppress only a component of the frequency band where the excessive amplitude occurs by the excessive amplitude in a case in which the excessive amplitude occurs. Therefore, it is possible to suppress harmonic distortion of a frequency where the excessive amplitude is caused, which is generated due to the excessive amplitude of the speaker, and to further reduce the IM distortion in which the signal of the high frequency band is lost due to the excessive amplitude of a low tone. As a result, it is possible to improve the quality of the sound output from the speaker. In addition, it is possible to prevent physical damage of the speaker and it is possible to improve quality of the sound reproduction system that reproduces music of high resolution, or the like.

Then, hereinafter, the present technology will be described more specifically.

First, a general dynamic type speaker unit will be described.

Figure 3:
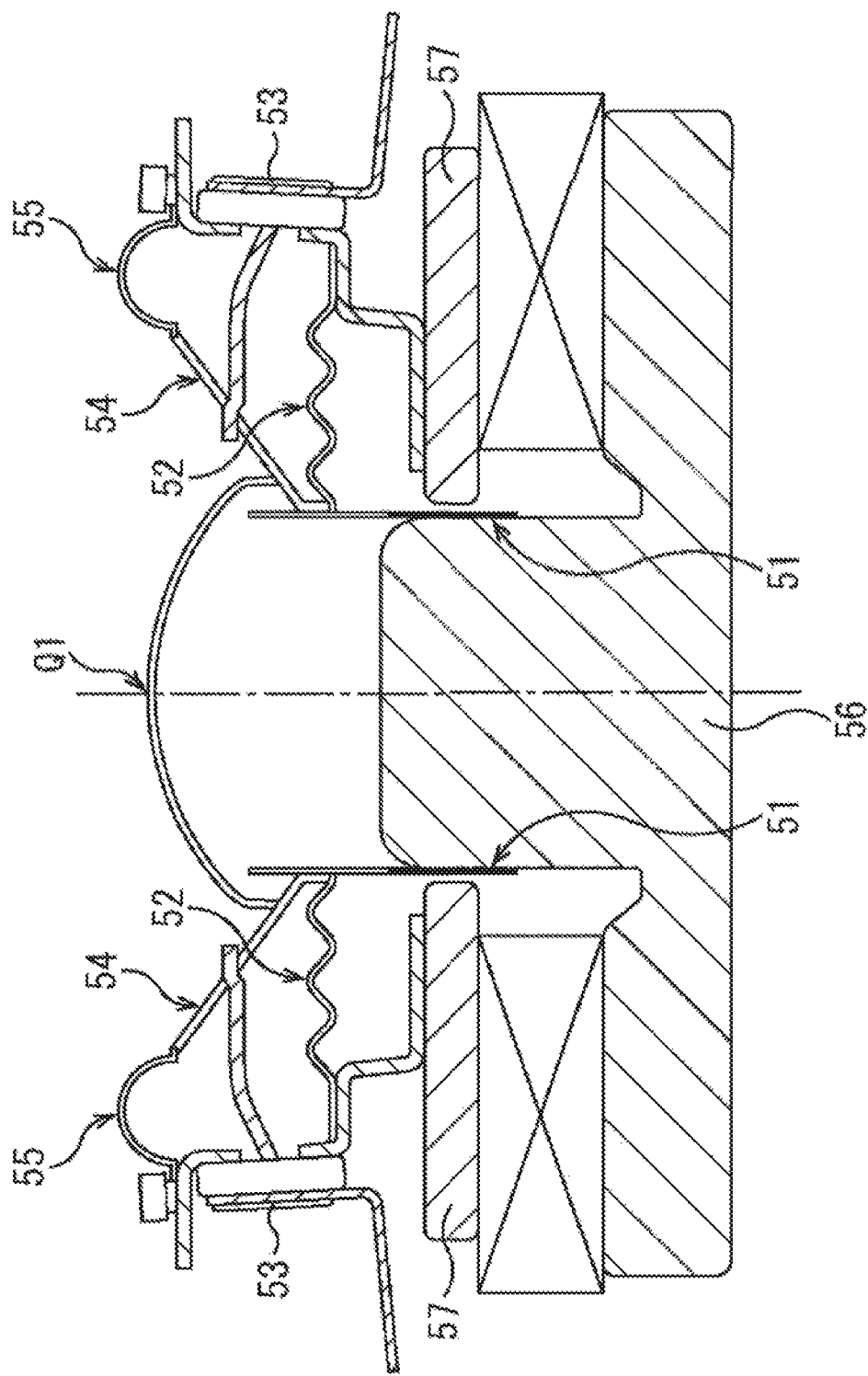
FIG. 3 is a diagram showing a cross section of a general dynamic type speaker unit.

FIG. 3 shows a cross section of the general dynamic type speaker unit.

In the dynamic type speaker unit, a voice coil 51 is fixed to a frame 53 through a damper 52. In addition, a diaphragm 54 is fixed to the frame 53 through an edge 55 that is a flexible film stretched so as to surround an outer periphery of the diaphragm 54. In addition, a magnet 57 is fixed to a pole piece 56 fixed to the frame 53, so as to surround an outer periphery of the voice coil 51.

When the speaker unit is driven, in a case in which an input signal is supplied, a current flows through the voice coil 51, and the diaphragm 54 vibrates in a vertical direction in the figure with respect to the frame 53 due to the Lorentz force. At this time, the voice coil 51 together with the diaphragm 54 vertically vibrates.

For example, it is assumed that a portion indicated by an arrow Q1 in the speaker unit is referred to as a center portion. In addition, it is assumed that a position of the central portion in a state in which the speaker unit is not driven is a reference position. When the speaker unit is driven, the central portion vibrates together with the diaphragm 54 in the vertical direction in the figure.

In this case, a movement distance in the vertical direction in the figure from the reference position of the position of the center portion when the speaker unit is driven becomes the absolute value of the displacement of the speaker unit, that is, an absolute value of a displacement of the diaphragm 54. In addition, in the figure, an upward direction, that is, a forward direction viewed from the speaker unit, is a positive direction of the displacement of the speaker unit, and a downward direction in the figure, that is, a backward direction viewed from the speaker unit, is a negative direction of the displacement of the speaker unit.

For example, in a case in which the displacement of the diaphragm 54 becomes too large at the time of driving the speaker unit and the excessive amplitude occurs, the voice coil 51 comes out of a magnetic circuit (yoke).

In addition, in a case in which the excessive amplitude occurs, the edge 55 or the damper 52 is stretched, the diaphragm 54 moves nonlinearly under the influence thereof, and in a case in which the displacement of the diaphragm 54 exceeds a physical limit, the speaker unit may also be damaged.

Figure 4:
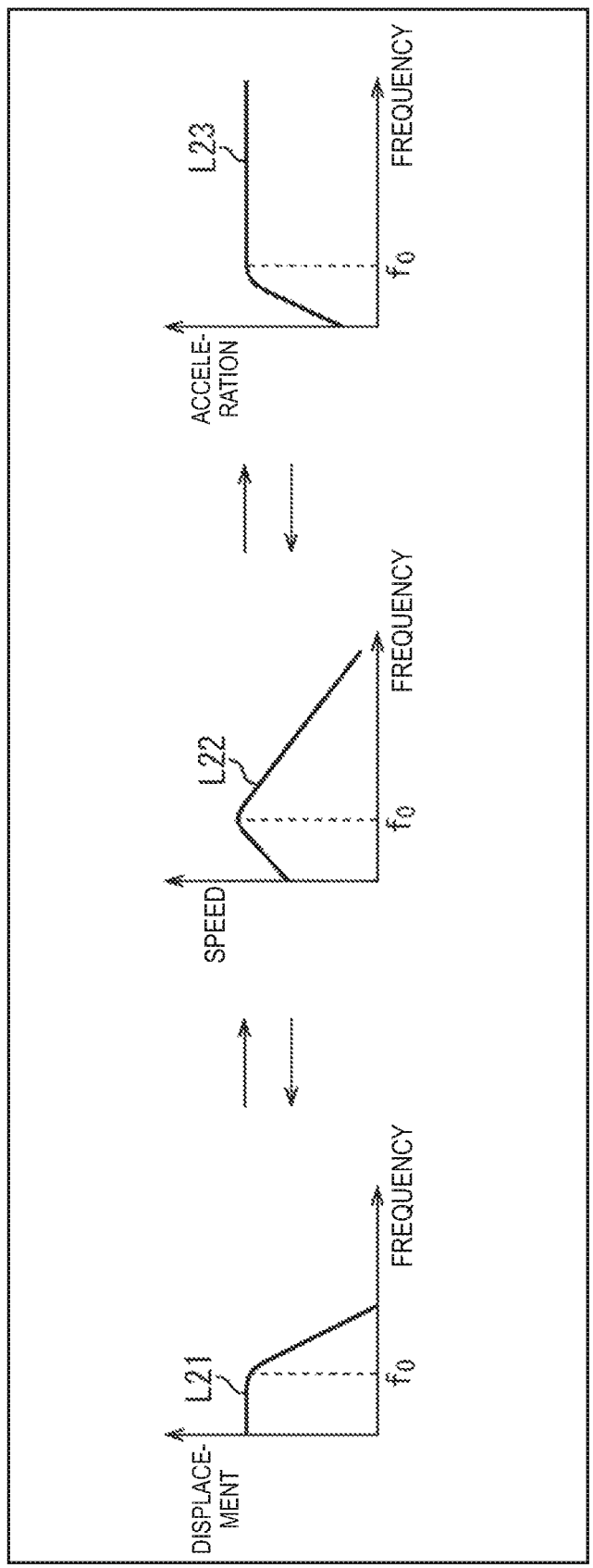
FIG. 4 is a diagram for explaining a relationship between displacement, speed, and acceleration of a diaphragm.

For example, a displacement characteristic of a sealed type speaker using the general dynamic type speaker unit is as shown in FIG. 4. Note that, in FIG. 4, a horizontal axis represents a frequency, and a vertical axis represents the displacement, speed, or acceleration of the diaphragm.

In FIG. 4, a curve L21 shows the displacement of the diaphragm of the speaker unit at each frequency, a curve L22 shows the speed of the diaphragm of the speaker unit at each frequency, and a curve L23 shows the acceleration of the diaphragm of the speaker unit at each frequency. Here, the frequency on a horizontal axis is also the frequency of the input signal input to the speaker unit and is also the frequency when the diaphragm vibrates, that is, the frequency of the output sound.

The displacement characteristic of the sealed type speaker using a general dynamic type speaker unit has a frequency characteristic as shown by the curve L21 on the left side in the figure.

In the example shown by the curve L21, the displacement characteristic has a flat characteristic at a frequency lower than a resonance frequency $f_0$, and the displacement attenuates at a slope of $-12$ dB/Oct as the frequency increases at a frequency higher than a resonance frequency $f_0$. This is a frequency characteristic is close to that of a second order low pass filter (LPF).

A value obtained by differentiating the displacement value shown by the curve L21 is the speed shown in the middle curve L22 in the figure. In the characteristic of the speed shown by the curve L22, the speed reaches the peak at the resonance frequency $f_0$. In addition, the speed attenuates at a slope of $-6$ dB/Oct as the frequency decreases at the frequency lower than the resonance frequency $f_0$, and the speed attenuates at a slope of $-6$ dB/Oct as the frequency increases at the frequency higher than the resonance frequency $f_0$.

Furthermore, a value obtained by differentiating the speed shown by the curve L22 is the acceleration shown by the curve L23 on the right side in the figure, that is, a sound pressure of the sound output from the speaker unit.

A characteristic of the sound pressure shown by the curve L23 has a flat characteristic at a frequency higher than the resonance frequency $f_0$, and the sound pressure (acceleration) attenuates at a slope of $-12$ dB/Oct as the frequency is reduced at a frequency lower than the resonance frequency $f_0$.

Therefore, at the frequency lower than the resonance frequency $f_0$, the sound pressure is small, but the displacement of the speaker is large. At the frequency higher than the resonance frequency $f_0$, the sound pressure is large, but the displacement of the speaker is small. From this, it can be seen that the excessive amplitude of the speaker occurs at a frequency lower than the vicinity of the resonance frequency.

Next, the IM distortion (cross modulation distortion) at the time of the excessive amplitude will be described.

Figure 5:
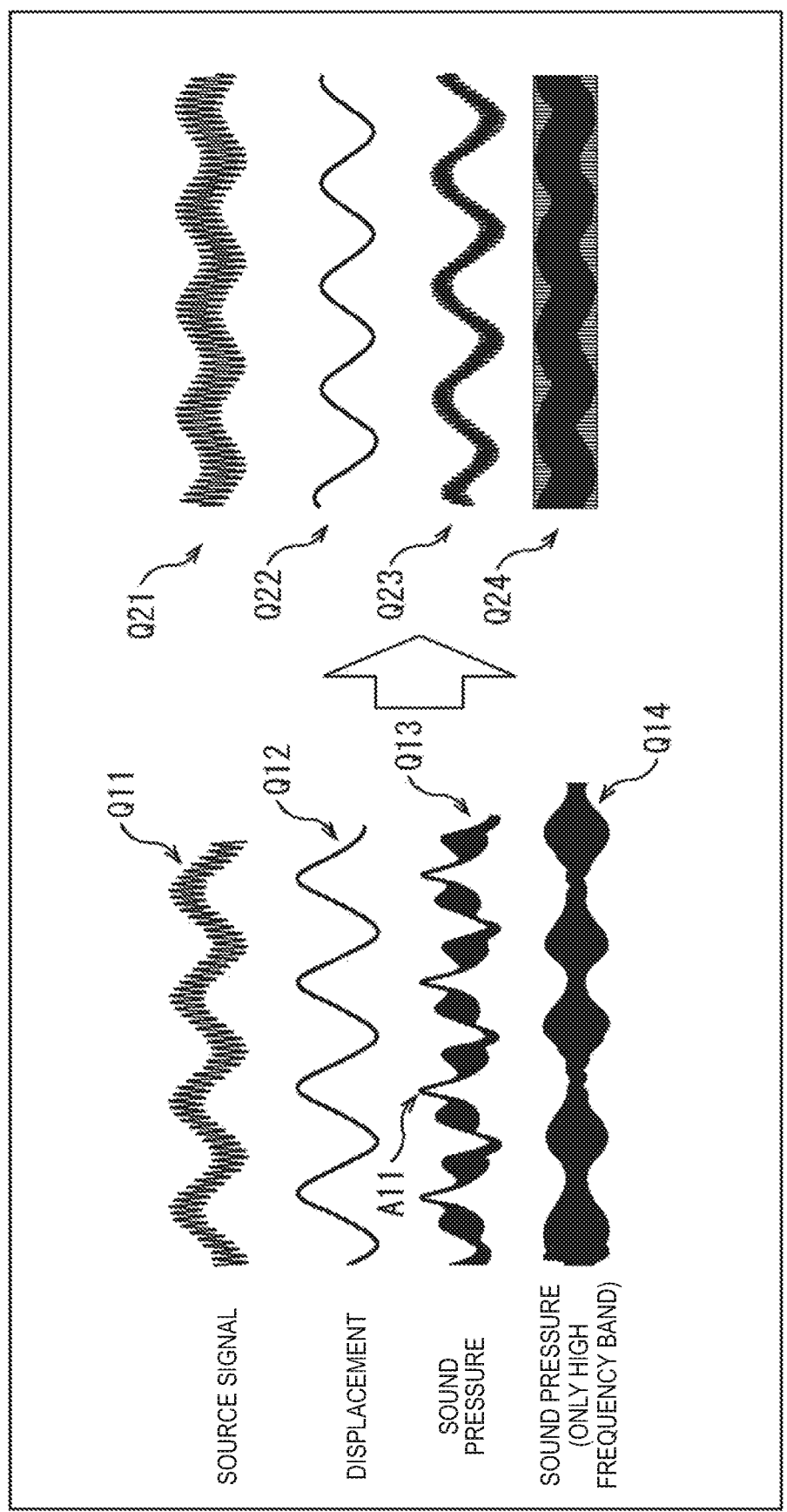
FIG. 5 is a diagram for explaining IM distortion.

For example, FIG. 5 shows each waveform when a source signal including two sinusoidal tone burst signals of 50 Hz and 2 kHz is input as the input signal to a speaker having the frequency at which the most excessive amplitude that occurs is 50 Hz. Note that, in FIG. 5, a horizontal axis represents time, and a vertical axis represents a signal level, the displacement of the speaker, or the sound pressure.

In FIG. 5, a waveform indicated by an arrow Q11 shows a waveform of the input signal output from the amplifier, that is, a waveform of the input signal input to the speaker, and a waveform indicated by an arrow Q12 shows the displacement of the speaker when the input signal indicated by the arrow Q11 is supplied to the speaker.

In addition, a waveform indicated by an arrow Q13 shows a waveform of the sound pressure of the sound output from the speaker, and a waveform indicated by an arrow Q14 shows a waveform of a high frequency component of the sound output from the speaker, that is, the sound pressure of the component of 2 kHz.

The waveforms indicated by the arrows Q11 to Q14 show waveforms in a state in which the control of the suppression of the excessive amplitude is not performed on the input signal.

On the other hand, the waveforms indicated by the arrows Q21 to Q24 show waveforms when the control of the suppression of the excessive amplitude is performed on the input signal corresponding to the waveforms indicated by the arrows Q11 to Q14, respectively.

That is, the waveform indicated by the arrow Q21 shows the waveform of the input signal output from the amplifier after the control of the suppression of the excessive amplitude is performed, and the waveform indicated by the arrow Q22 shows the displacement of the speaker when the input signal indicated by the arrow Q21 is supplied to the speaker.

In addition, the waveform indicated by the arrow Q23 shows the waveform of the sound pressure of the sound output from the speaker on the basis of the input signal indicated by the arrow Q21, and the waveform indicated by the arrow Q24 shows the waveform of the sound pressure of the high frequency component of the sound output from the speaker on the basis of the input signal indicated by the arrow Q21.

For example, in a case in which the input signal indicated by the arrow Q11 is input to the speaker and the excessive amplitude occurs, a time waveform of the displacement of the speaker becomes a triangular wave of 50 Hz as indicated by the arrow Q12, which is supposed to be a sine wave as it is originally, and harmonic distortion increases.

In addition, in the sound pressure, in a case in which the diaphragm of the speaker generates the excessive amplitude at 50 Hz and the voice coil comes out of the magnetic circuit, in a case in which force coefficient, that is, a BL value, approaches 0, the diaphragm at 50 Hz is moved by inertia, but, a signal is not transmitted to the diaphragm at 2 kHz and the component of 2 kHz is lost.

In the example indicated by the arrow Q13, for example, it can be seen that the component of 2 kHz is lost in a portion indicated by the arrow A11, and the like.

Furthermore, in this case, paying attention to the sound pressure of the 2 kHz component, the waveform of the sound pressure periodically changes as indicated by the arrow Q14, and it can be seen that amplitude modulation is applied at 50 Hz.

Therefore, for example, in a case in which the sound is reproduced by the speaker on the basis of the input signal of the sound including a 50 Hz bass drum and a 2 kHz vocal, the excessive amplitude occurs when the bass drum sounds, and a phenomenon in which a vocal voice singing is reproduced at the same time as the vocal voice shakes occurs. That is, the IM distortion occurs.

On the other hand, it is possible to prevent the voice coil from coming out from the magnetic circuit by detecting the occurrence of the excessive amplitude and performing the control to suppress the excessive amplitude. Therefore, as shown by the arrows Q21 to Q24 on the right side in the figure, it is possible to suppress reduction of the quality of the sound.

In this example, for example, the harmonic distortion of the 50 Hz component itself is also reduced as indicated by the arrow Q22. In addition, the signal is also accurately transmitted to the diaphragm for the 2 kHz component as indicated by the arrows Q23 and Q24, and it can be seen that the loss of the 2 kHz component is not occurred.

Subsequently, an equivalent circuit of the speaker will be described.

Figure 6:
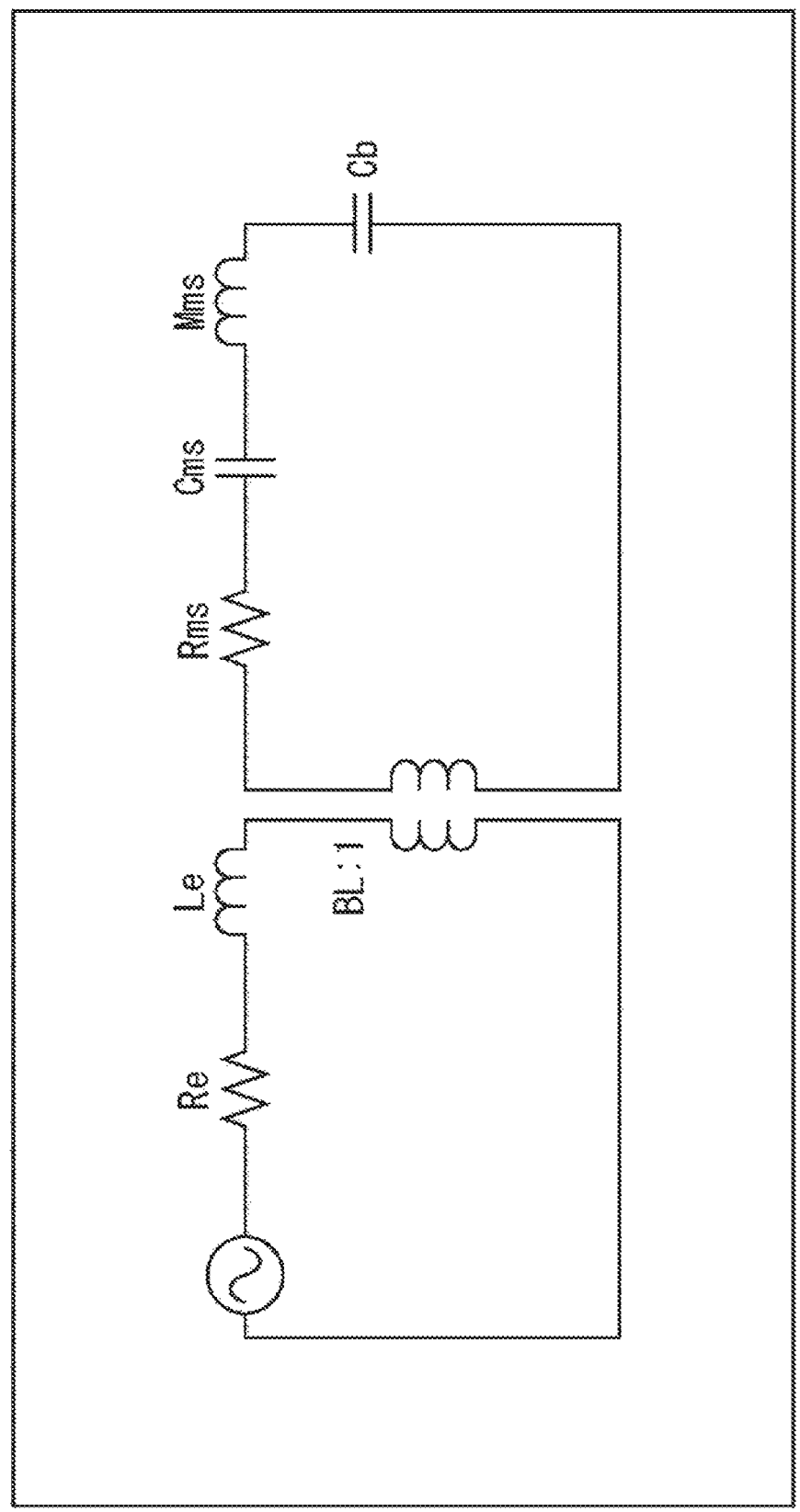
FIG. 6 is a diagram showing an equivalent circuit of a speaker.

FIG. 6 shows an equivalent circuit of the sealed type speaker using the dynamic type speaker unit. In particular, in the figure, a circuit of the left side in the figure shows an equivalent circuit of an electric system, and the right side in the figure shows an equivalent circuit of a mechanical system.

In addition, each letter in FIG. 6 indicates each parameter called a TS parameter.

That is, Re indicates a direct current resistance [Ω] of the voice coil, Le indicates an inductance [mH] of the voice coil, and BL indicates a force coefficient, that is, the BL value [N/A]. The force coefficient BL is obtained from a product of a magnetic flux density in a portion of the voice coil and the magnetic circuit and a coil length of the voice coil.

In addition, Rms indicates a mechanical resistance [Nxs/m], Cms indicates a mechanical system compliance [m/N] that is an index indicating softness of a suspension of a unit, Mms indicates a vibration system equivalent mass [g]. The vibration system equivalent mass Mms is a sum of a weight of the diaphragm and the voice coil and a weight of an air in the front and rear of the diaphragm.

Furthermore, Cb indicates a compliance [m/N] of an air spring in a sealed box of the sealed type speaker.

Figure 7:
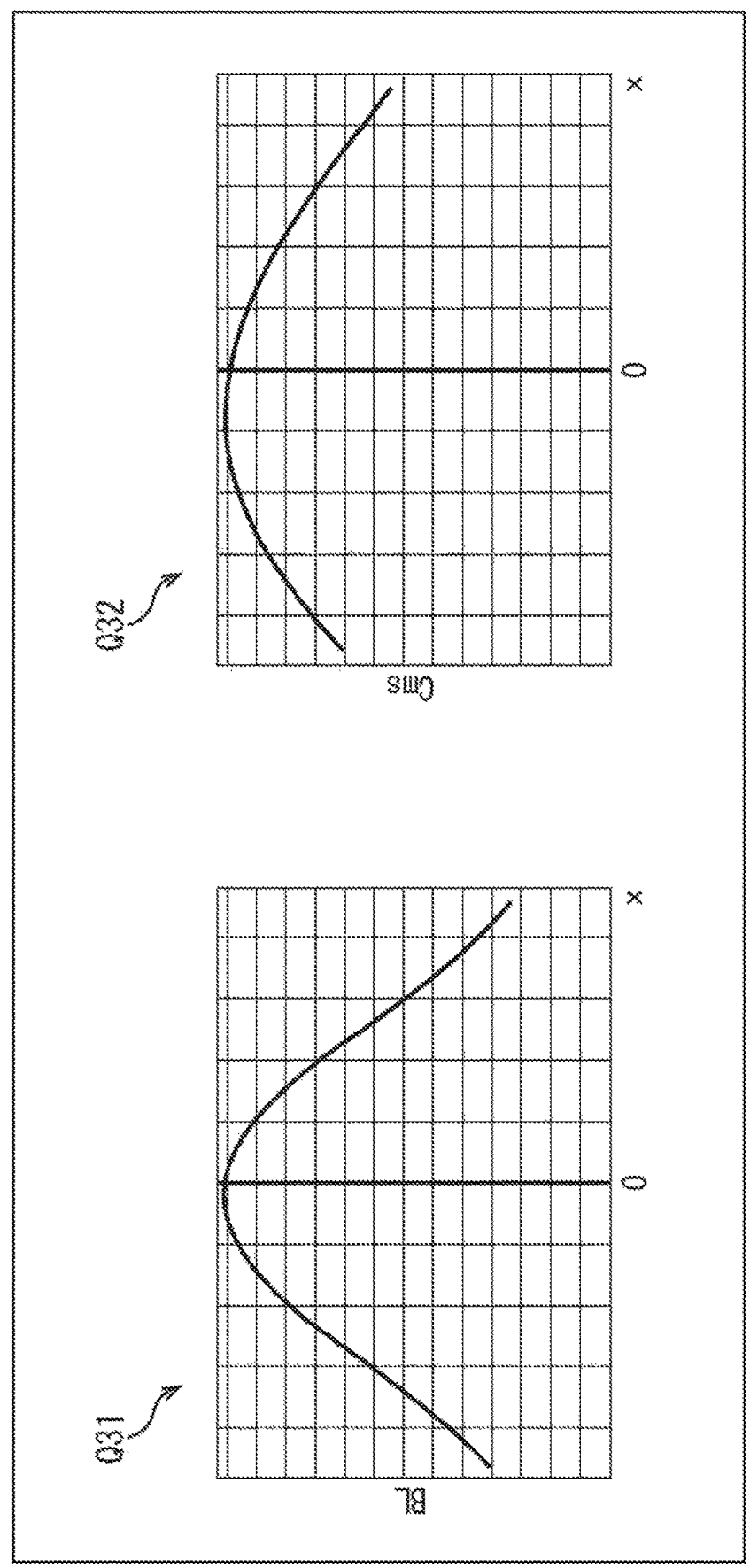
FIG. 7 is a diagram for explaining a force coefficient and mechanical system compliance.

Here, among such TS parameters, the force coefficient BL and the mechanical system compliance Cms depend on, for example, the displacement of the diaphragm as shown in FIG. 7.

Note that, in FIG. 7, a horizontal axis represents the displacement x of the diaphragm, and a vertical axis represents a value of the force coefficient BL or a value of the mechanical system compliance Cms. Particularly, with regard to the displacement x, a state in which the diaphragm is stopped is displacement x=0, and a position where the displacement x is larger than 0, that is, a position on the right side in the figure from the position of x=0 is a position of a positive direction of the diaphragm. Here, in a case in which the position x is the positive position, the diaphragm is in a state in which the diaphragm has moved in a forward direction, that is, in an emission direction of the sound. On the other hand, in a case in which the displacement x is a position smaller than 0, the position of the diaphragm becomes a position of a negative direction, and the diaphragm is in a state in which the diaphragm has moved in a backward direction, that is, in a direction opposite to the emission direction of the sound.

In FIG. 7, a curve indicated by an arrow Q31 shows the force coefficient BL at each displacement x, and a curve indicated by an arrow Q32 shows the mechanical compliance Cms at each displacement x. As can be seen from such curves, the force coefficient BL and the mechanical system compliance Cms depend on the displacement x of the diaphragm, and as the absolute value of the displacement x increases, the values of the force coefficient BL and the mechanical system compliance Cms attenuate even in a case in which the displacement x is in the forward position or a case in which and the displacement x is in the backward position.

For example, the value of the force coefficient BL starts to attenuate in a case in which the voice coil comes out of the magnetic circuit, and the value of the mechanical system compliance Cms becomes hard to move because the edge or damper is stretched as the displacement x increases. In addition, the movement of the diaphragm, that is, the speaker becomes non-linear by a change of the force coefficient BL and the mechanical system compliance Cms by the displacement x.

In a case in which a non-linear TS parameter such as the force coefficient BL and the mechanical system compliance Cms is changed according to the displacement x, it is possible to predict the characteristics the same as the actual speaker by a speaker simulator. In the speaker simulator, the characteristic of the speaker is predicted using a speaker equivalent model determined from the TS parameter.

Figure 8:
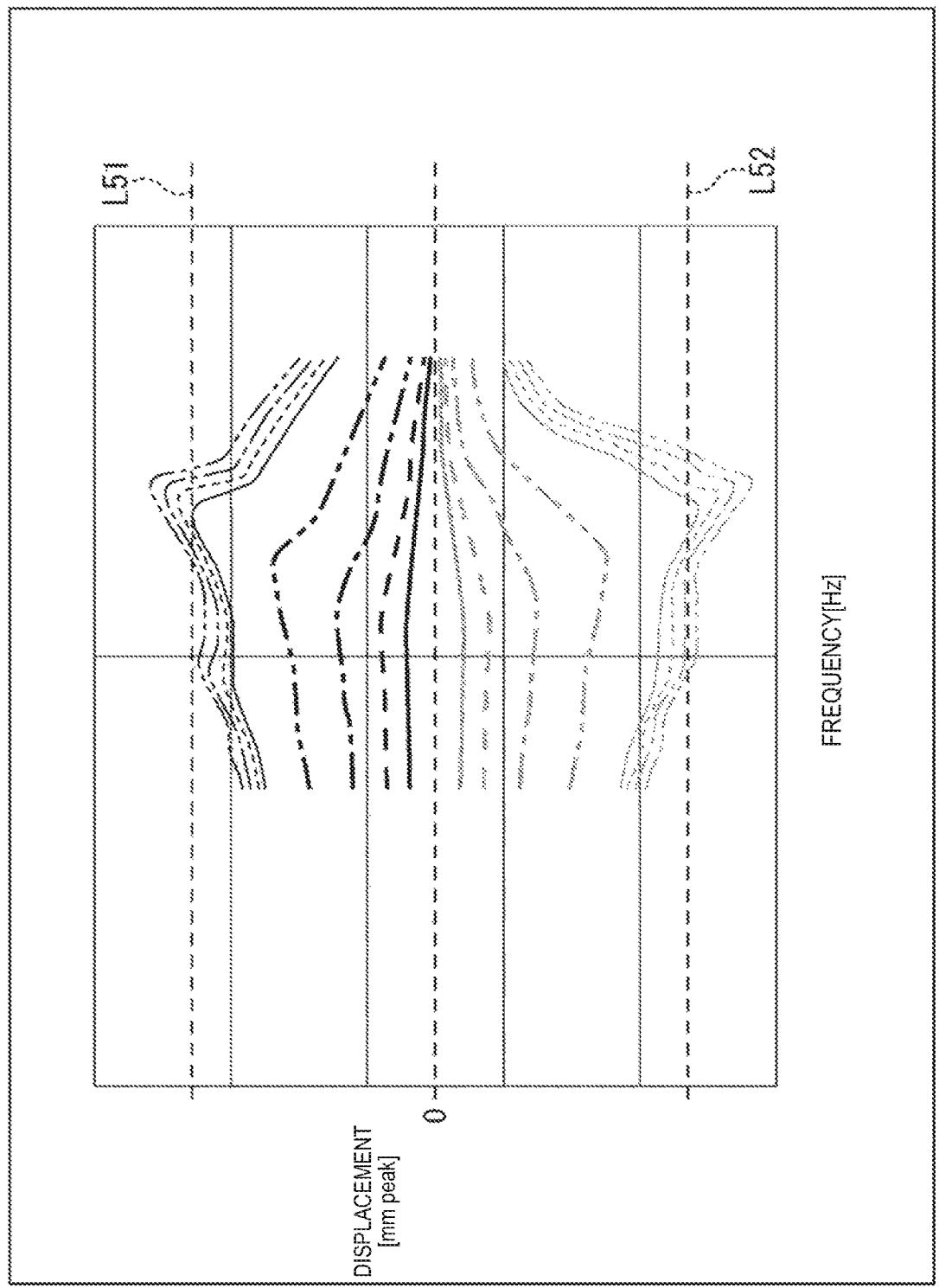
FIG. 8 is a diagram showing a simulation result by a speaker simulator.

In a case in which the amplitude of the speaker, that is, the frequency characteristic of the displacement x is simulated using the TS parameter including the nonlinearly changing force coefficient BL and the mechanical system compliance Cms, for example, a result shown in FIG. 8 is obtained. Note that, in FIG. 8, a horizontal axis represents the frequency, and a vertical axis represents the displacement x of the diaphragm.

In this example, forward and backward displacements x of the diaphragm at respective frequencies when a plurality of input signals having different effective values of voltage are supplied to the speaker are shown. In addition, in FIG. 8, the excess amplitude of the speaker occurs at the displacement x on an upper side in the figure than a position of a straight line L51 and the displacement x on a lower side in the figure than a position of a straight line L52.

In the example shown in FIG. 8, as for the displacement x of the diaphragm, there is a peak of the displacement x in the front direction and the rear direction, and while the effective value of the voltage of the input signal is small, it can be seen that the displacement x changes almost linearly with respect to the change in the voltage level. However, in a case in which the effective value of the voltage of the input signal increases, the displacement x changes non-linearly with respect to the change in the voltage level.

In the present technology, the prediction value of the displacement of the speaker, that is, the diaphragm is calculated by feed-forward by using such a speaker simulator, and in a case in which the prediction value exceeds a threshold, which is the excessive amplitude, the control to suppress the excessive amplitude is performed.

<Configuration Example of Sound Reproduction System>

Figure 9:
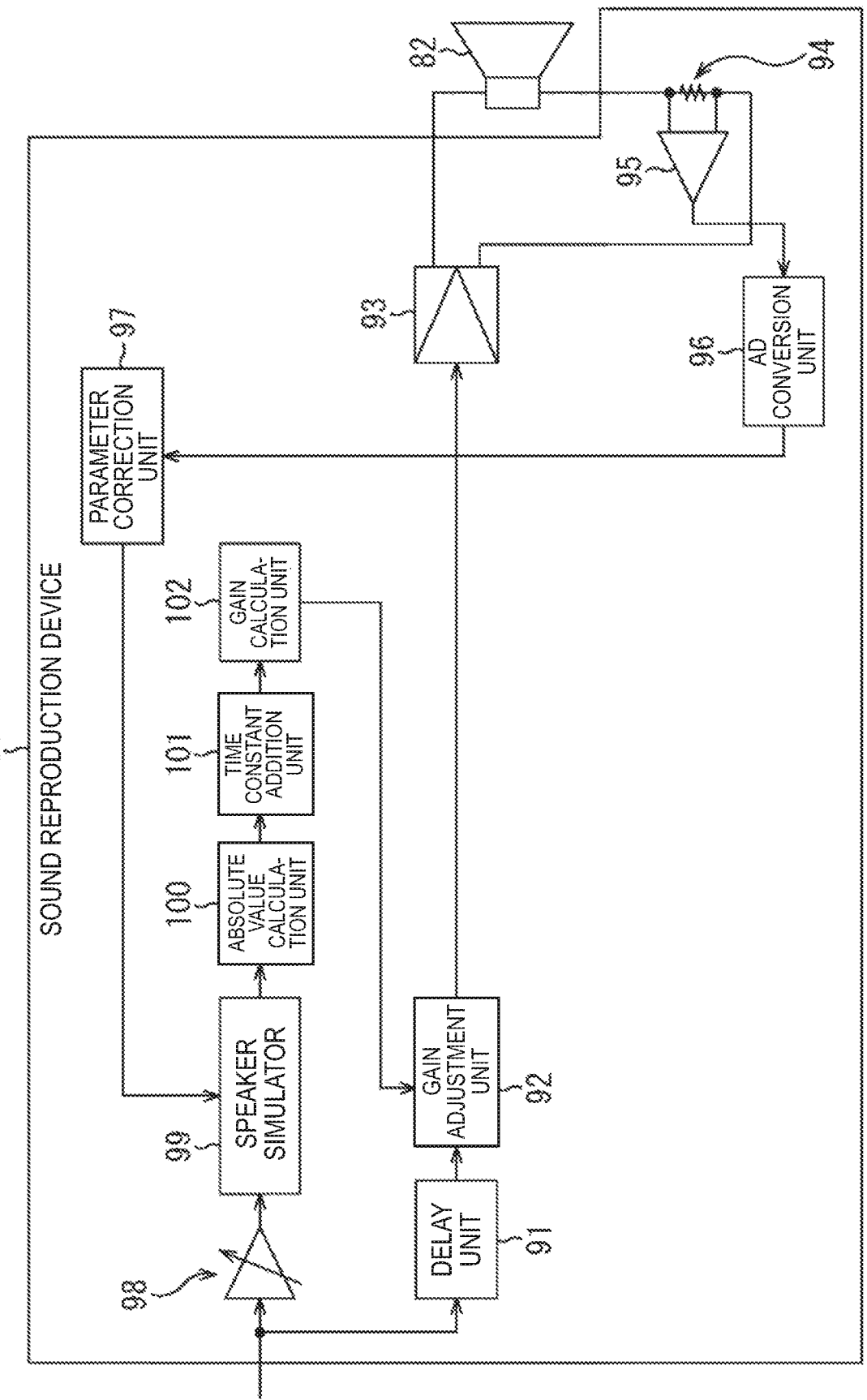
FIG. 9 is a diagram showing a configuration example of a sound reproduction system to which the present technology is applied.

FIG. 9 is a diagram showing a configuration example of an embodiment of a sound reproduction system to which the present technology is applied.

The sound reproduction system shown in FIG. 9 has a sound reproduction device 81 and a speaker 82.

In the sound reproduction device 81, a sound signal in a time domain for reproducing sound by the speaker 82, that is, a source signal is supplied as an input signal. The sound reproduction device 81 suitably carries out a process of suppressing the excessive amplitude on the supplied input signal and supplies the input signal to the speaker 82.

The speaker 82 is a sealed type speaker using, for example, a dynamic type speaker unit capable of reproducing music of high resolution (high resolution) and the like, reproduces sound on the basis of the input signal supplied from the sound reproduction device 81. Note that, the speaker 82 may be of any type as long as the speaker 82 is a speaker that generates an excessive amplitude, other than the dynamic type speaker.

In addition, the sound reproduction device 81 has a delay unit 91, a gain adjustment unit 92, an amplifier 93, a detection resistor 94, a differential amplifier 95, an AD conversion unit 96, a parameter correction value 97, an amplification unit 98, a speaker simulator 99, an absolute value calculation unit 100, a time constant addition unit 101, and a gain calculation unit 102.

In this sound reproduction device 81, the detection resistor 94 for measuring the current is connected to the speaker 82 in series, and the current flowing through the detection resistor 94, that is, the voice coil of the speaker 82 is actually measured from a voltage between both ends of the detection resistor 94 by the differential amplifier 95. In addition, the parameter correction unit 97 calculates a parameter correction value used for correcting the TS parameter on the basis of the actual measurement value of the current.

The sound reproduction device 81 will be described more specifically.

The delay unit 91 delays the input signal supplied from the outside by a predetermined time and then supplies the input signal to the gain adjustment unit 92. Here, the time by which the input signal is delayed is, for example, a time corresponding to a delay time (transient response time) of an operation of the actual speaker 82 with respect to the input signal.

For example, the gain adjustment unit 92 includes an infinite impulse response (IIR) type filter such as a dynamic bus shelving filter or a dynamic equalizer (EQ), and the like, and functions as an amplitude control unit that performs gain adjustment, that is, amplitude control on the input signal.

The gain adjustment unit 92 updates a filter coefficient to be used for a filter process on the basis of the gain value supplied from the gain calculation unit 102, carries out the filter process on the input signal supplied from the delay unit 91 using the obtained filter coefficient, and supplies the input signal to the amplifier 93.

By performing the filter process on the input signal in the gain adjustment unit 92, gain adjustment is performed for each frequency component of the input signal. The process for the gain adjustment of each such frequency component is a process of suppressing the excessive amplitude of the speaker 82, that is, a process of controlling the suppression of the excessive amplitude.

The amplifier 93 multiplies the input signal supplied from the gain adjustment unit 92 by a gain value to amplify the input signal so that the input signal is amplified by a predetermined gain or a volume adjustment operation by a user or the like, and supplies the amplified input signal to the speaker 82. The input signal supplied from the amplifier 93 to the speaker 82 is an analog voltage signal.

In a case in which the input signal is supplied to the speaker 82 by the amplifier 93, the current flows not only to the voice coil of the speaker 28 but also to the detection resistor 94.

The differential amplifier 95 measures (actually measures) the current flowing through the detection resistor 94 using the voltage at the both ends of the detection resistor 94 as an input and supplies the analog measured value obtained as a result to the AD conversion unit 96 as a current actual measurement value. The AD conversion unit 96 performs AD conversion on the current actual measurement value supplied from the differential amplifier 95 from the analog value to a digital value, and supplies the current actual measurement value to the parameter correction unit 97.

Note that, an example in which the detection resistor 94 and the differential amplifier 95 are provided to measure the current flowing through the speaker 82 is described, but in addition to this, for example, a current sensor may be connected to the speaker 82 and the current flowing through the speaker 82 may be measured by the current sensor to obtain the current actual measurement value.

The parameter correction unit 97 calculates a parameter correction value used for correcting the TS parameter on the basis of the current actual measurement value supplied from the AD conversion unit 96 and supplies the parameter correction value to the speaker simulator 99.

The parameter correction value obtained by the parameter correction unit 97 may be, for example, a correction value of the TS parameter itself, or may be a value such as Q indicating sharpness of an impedance characteristic of the speaker 82 or a resonance frequency $f_0$ used for correcting the TS parameter. Hereinafter, a case in which the resonance frequency $f_0$ of the speaker 82 is used as the parameter correction value will be described as a specific example.

In addition, a part or all of the amplifier 93, the detection resistor 94, the differential amplifier 95, and the AD conversion unit 96 may be provided outside the sound reproduction device 81.

The amplification unit 98 amplifies the input signal output from the outside by an amount corresponding to the amplification in the amplifier 93, and supplies the input signal to the speaker simulator 99. Therefore, it is possible to input an input signal having the same signal level as the input signal actually supplied (applied) to the speaker 82 to the speaker simulator 99, and it is possible to predict the displacement x of the speaker 82 with higher accuracy.

The speaker simulator 99 obtains the displacement x of the diaphragm of the speaker 82 by supply of the input signal by prediction on the basis of the input signal supplied from the amplification unit 98 and the parameter correction value supplied from the parameter correction unit 97, and supplies the displacement x to the absolute value calculation unit 100. That is, the speaker simulator 99 functions as a prediction value calculation unit that calculates the prediction value of the displacement of the speaker 82 according to the input signal supplied to the speaker 82, on the basis of the speaker equivalent model.

Specifically, for example, the speaker simulator 99 corrects the mechanical system compliance Cms as the TS parameter on the basis of the resonance frequency $f_0$ as the parameter correction value. That is, the mechanical system compliance Cms, that is the TS parameter of the speaker equivalent model, is corrected according to the current actual measurement value that is the actual measurement value of the current flowing through the speaker 82.

In addition, the speaker simulator 99 obtains the speed of the speaker 82 (mechanical system) from the speaker equivalent model of the speaker 82 determined from the TS parameter including the corrected mechanical system compliance Cms, that is, the equivalent circuit described with reference to FIG. 6, and the input signal, and further obtains the displacement, more specifically the prediction value of the displacement x, by integrating the speed. Hereinafter, the prediction value of the displacement x obtained by the speaker simulator 99 is also particularly referred to as a displacement prediction value.

In the speaker simulator 99, by using such a speaker equivalent model, it is possible to predict the displacement x with high accuracy. In particular, by using the force coefficient BL and the mechanical system compliance Cms that are the TS parameter of the speaker equivalent model, which non-linearly changes with respect to the displacement x, it is possible to simulate the movement of the speaker 82 that non-linearly operates.

The absolute value calculation unit 100 calculates the absolute value of the displacement prediction value supplied from the speaker simulator 99 and supplies the absolute value to the time constant addition unit 101.

The time constant addition unit 101 adds a time constant to the absolute value of the displacement prediction value supplied from the absolute value calculation unit 100 and supplies the absolute value to which the time constant is added to the gain calculation unit 102. Specifically, for example, when the time constant is added, a release time is 1 second at a time at which an attack time is 0 seconds.

The gain calculation unit 102 compares the absolute value of the displacement prediction value to which the time constant is added supplied from the time constant adding unit 101 with an excessive amplitude limit value of the displacement of the speaker 82 which is a predetermined threshold value, calculates a gain value according to a comparison result, and supplies the gain value to the gain adjustment unit 92.

Here, the excessive amplitude limit value is an allowable maximum value as the displacement value of the speaker 82, and is, for example, a maximum magnitude of the displacement which does not become the excessive amplitude.

For example, in the gain calculation unit 102, the gain value is calculated and output only in a case in which the absolute value of the displacement prediction value is larger than the excessive amplitude limit value. At this time, the gain value is a ratio of the excessive amplitude limit value to the absolute value of the displacement prediction value, that is, a value obtained by dividing the excessive amplitude limit value by the absolute value of the displacement prediction value, and the like. On the other hand, when the absolute value of the displacement prediction value is equal to or less than the excessive amplitude limit value, the gain value is not output and the gain value substantially becomes 1.

In the gain adjustment unit 92, for example, a filter coefficient for realizing a filter having an inverse characteristic of the frequency characteristic of the displacement of the speaker 82 is prepared, and the gain adjustment unit 92 updates (changes) the filter coefficient on the basis of the gain value supplied from the gain calculation unit 102. At this time, the gain adjustment unit 92 obtains a new filter coefficient so that a characteristic of the filter of the frequency band in which the excess amplitude occurs by the gain value from the gain calculation unit 102 is corrected. That is, the filter coefficient is updated.

Therefore, it can be said that only in a case in which the absolute value of the displacement prediction value is larger than the excessive amplitude limit value, the gain adjustment unit 92 performs gain adjustment (amplitude control) for realizing suppression control of the excessive amplitude on the input signal.

As described above, only in a case in which the absolute value of the displacement prediction value is larger than the excessive amplitude limit value, that is, only in a case in which the excessive amplitude occurs, the sound reproduction device 81 calculates a difference of the gain of the absolute value of the displacement prediction value and the excessive amplitude limit value. In addition, a component of the frequency band in which the input signal is dynamically excessively amplified is suppressed by the gain adjustment by the amount exceeding the gain of the excessive amplitude limit value.

In addition, since the speaker simulator 99 simulates the movement of the speaker 82, the output of the speaker simulator 99 also has a slow rise, and a delay occurs until the excessively amplified input signal is input and becomes the displacement prediction value that is actually excessively amplified. Therefore, in the delay unit 91, the input signal is delayed by the delay time and is supplied to the gain adjustment unit 92. Therefore, only when the excessive amplitude occurs, it is possible to perform control to suppress the excessive amplitude from the portion where the excessive amplitude starts to occur.

In the sound reproduction system as described above, for example, the frequency characteristics of the displacement of the speaker 82 when the dynamic excessive amplitude suppression control is turned on and off are as shown in FIG. 10. Note that, in FIG. 10, a horizontal axis represents the frequency and a vertical axis represents the displacement of the speaker 82. In addition, in FIG. 10, the excessive amplitude of the speaker 82 occurs at the displacement on an upper side in the figure than a position of a straight line L71 and the displacement on a lower side in the figure than a position of a straight line L72. That is, the displacement shown by the straight line L71 and the straight line L72 shows the excessive amplitude limit value.

In FIG. 10, the displacement of the diaphragm of the speaker 82 at each frequency for a plurality of input signals having different effective values of voltage are shown as frequency characteristics.

In particular, in a portion indicated by an arrow Q51, the frequency characteristic of the displacement when the suppression control of the dynamic excessive amplitude is turned off, that is, when the filter coefficient by the gain value output from the gain calculation unit 102 is not updated is shown.

On the other hand, in a portion indicated by an arrow Q52, the frequency characteristic of the displacement when the suppression control of the dynamic excessive amplitude is turned on, that is, when the filter coefficient by the gain value output from the gain calculation unit 102 is updated is shown.

From such frequency characteristics, it can be seen that the excessive amplitude occurs when the filter coefficient is not updated in the gain adjustment unit 92, however, in a case in which the filter coefficient is updated by the gain value, only in a case in which the excessive amplitude occurs, the suppression control of the excessive amplitude is performed and the displacement is suppressed to the excessive amplitude limit value.

<Description of Reproduction Process>

Next, an operation of the sound reproduction system shown in FIG. 9 will be described.

That is, hereinafter, a reproduction process by the sound reproduction system will be described with reference to a flowchart of FIG. 11. Note that, this reproduction process is started in a case in which the input signal is supplied to the sound reproduction device 81.

In step S11, the delay unit 91 delays the supplied input signal by a predetermined time, and supplies the delayed input signal to the gain adjustment unit 92. As described above, by delaying the supply of the input signal to the gain adjustment unit 92, it is possible to predict the displacement of the speaker 82 by feed forward.

In addition, the input signal is also supplied to the amplification unit 98. The amplification unit 98 amplifies the supplied input signal by the same amount as that amplified by the amplifier 93, and supplies the amplified input signal to the speaker simulator 99.

In step S12, the speaker simulator 99 calculates the displacement prediction value on the basis of the input signal supplied from the amplification unit 98 and the parameter correction value supplied from the parameter correction unit 97, and supplies the calculated displacement prediction value to the absolute value calculation unit 100.

That is, the speaker equivalent model is used and the displacement of the speaker 82 is predicted.

For example, the speaker simulator 99 corrects the mechanical system compliance Cms as the TS parameter on the basis of the resonance frequency f0 supplied as the parameter correction value, and calculates the displacement prediction value from the TS parameter and the input signal.

In addition, the absolute value calculation unit 100 calculates the absolute value of the displacement prediction value supplied from the speaker simulator 99, and supplies the obtained absolute value to the time constant addition unit 101. The time constant addition unit 101 adds the time constant to the absolute value of the displacement prediction value supplied from the absolute value calculation unit 100 and supplies the obtained absolute value of the displacement prediction value to the gain calculation unit 102.

In step S13, the gain calculation unit 102 compares the absolute value of the displacement prediction value supplied from the time constant addition unit 101 with the excessive amplitude limit value that is a predetermined threshold value.

In step S14, the gain calculation unit 102 calculates the gain value on the basis of a comparison result in the process of step S13 and supplies the gain value to the gain adjustment unit 92.

That is, in a case in which the absolute value of the displacement prediction value is larger than the excessive amplitude limit value, the gain calculation unit 102 calculates the ratio between the absolute value of such a displacement prediction value and the excessive amplitude limit value as the gain value. Note that, in a case in which the absolute value of the displacement prediction value is equal to or less than the excessive amplitude limit value, the gain value is not particularly calculated.

In step S15, the gain adjustment unit 92 updates the filter coefficient held in advance on the basis of the gain value supplied from the gain calculation unit 102. Note that, in a case in which the gain value is not supplied from the gain calculation unit 102, the filter coefficient is not updated. In this case, it is considered that the gain value is substantially 1 and the filter coefficient is updated.

In step S16, the gain adjustment unit 92 performs the filter process on the input signal delayed in step S11 and supplied from the delay unit 91 by using the filter coefficient obtained in step S15, to perform the gain adjustment of the input signal. In the filter process, a convolution process of the filter coefficient and the input signal is performed.

The gain adjustment unit 92 supplies the input signal obtained as described above to the amplifier 93. The amplifier 93 amplifies the input signal supplied from the gain adjustment unit 92 and supplies the amplified input signal to the speaker 82.

In step S17, the speaker 82 reproduces the sound on the basis of the input signal supplied from the amplifier 93. Therefore, driving in which the excessive amplitude is suitably suppressed is performed, and reproduced sound is output from the speaker 82.

In step S18, the differential amplifier 95 measures the current flowing through the speaker 82, that is, the detection resistor 94 from the voltage at the both ends of the detection resistor 94, and the measurement result to the AD conversion unit 96. The AD conversion unit 96 converts the current actual measurement value that is the measurement result supplied from the differential amplifier 95 from the analog value to the digital value and supplies the digital value to the parameter correction unit 97.

In step S19, the parameter correction unit 97 calculates the parameter correction value on the basis of the current actual measurement value supplied from the AD conversion unit 96, supplies the parameter correction value to the speaker simulator 99, and ends the reproduction process.

For example, the parameter correction unit 97 calculates the resonance frequency $f_0$ as the correction parameter on the basis of the current actual measurement value. The correction parameter calculated as described above is used in the process of step S12 of the reproduction process to be performed next.

As described above, the sound reproduction system calculates the prediction value of the displacement of the speaker by feed-forward using the speaker equivalent model, and in a case in which the absolute value of the displacement prediction value exceeds the excessive amplitude limit value, the sound reproduction system updates the filter coefficient by the gain value and performs control to suppress the excessive amplitude. In particular, in the sound reproduction system, by delaying the input signal by the delay unit 91, it is possible to perform the suppression control of the excessive amplitude also for the portion where the excessive amplitude starts to occur. Therefore, it is possible to perform more accurate suppression control of the excessive amplitude, and it is possible to obtain a sound of higher quality.

In addition, in the sound reproduction system, by measuring the current flowing through the speaker 82 and correcting the TS parameter, that is, the speaker equivalent model according to the actual measurement result, it is possible to cope with individual variation and aging of the speaker 82. Therefore, it is possible to perform more accurate suppression control of the excessive amplitude.

Furthermore, since it is possible to realize more accurate suppression control of the excessive amplitude, it is possible to suppress only the component of the frequency band in which the excessive amplitude occurs by the excessive amplitude in a case in which the excessive amplitude occurs. Therefore, it is possible to suppress the harmonic distortion of the frequency at which the excessive amplitude occurs, which is caused by the excessive amplitude of the speaker 82 and to reduce the IM distortion that the signal of the high frequency band is lost due to the excessive amplitude of the low tone. As a result, it is possible to improve the quality of the sound output from the speaker 82. In addition, it is possible to prevent the physical damage of the speaker 82 and improve the quality of the sound reproduction system that reproduces music of high resolution, and the like.

In particular, in a reproduction speaker corresponding to high resolution, there is a speaker capable of reproducing a band outside an audible band of 20 kHz or more with a full range. In addition, even in woofer with a separate tweeter, a frequency characteristic of such a speaker makes a crossover at several kHz, and a slope of a filter thereof is also −12 dB/Oct or the like.

Therefore, in a case in which such a speaker is used as the speaker 82, in a case in which the full range speaker or woofer causes the excessive amplitude and thus the IM distortion occurs in a situation in which the speaker is reproduced to the high frequency band, the influence thereof extends to the high frequency band. Therefore, by reducing the IM distortion due to the excessive amplitude by the present technology, it is possible to improve the performance of the sound reproduction system extending to the outside of the audible band.

Second Embodiment

<Configuration Example of Sound Reproduction System>

Note that, in the above description, the example in which the TS parameter is corrected on the basis of the parameter correction value has been described. However, the displacement of the speaker 82 (hereinafter also referred to as a measurement displacement value) may be calculated from the current actual measurement value of the speaker 82, and the displacement prediction value may be suitably corrected.

Figure 12:
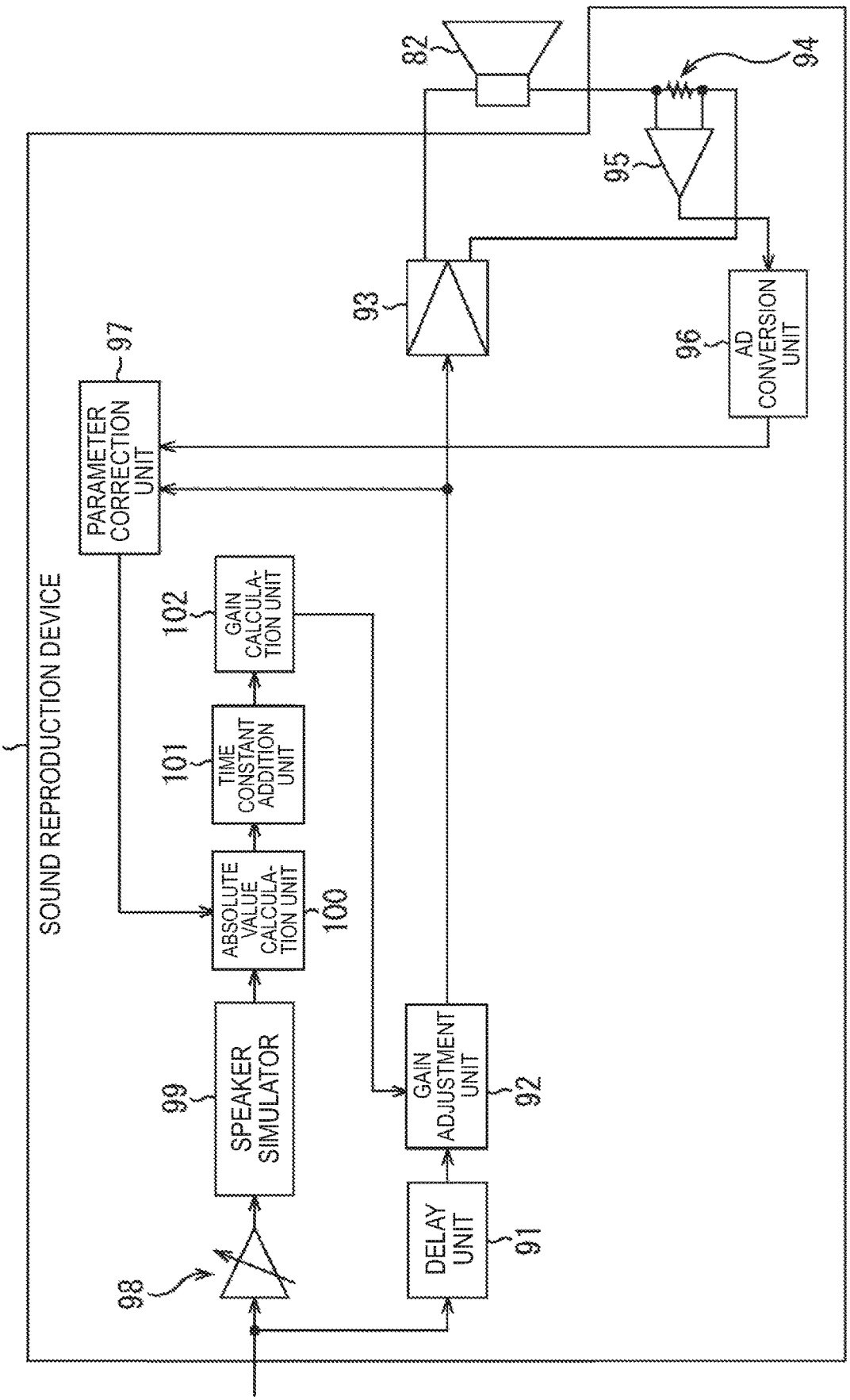
FIG. 12 is a diagram showing another configuration example of the sound reproduction system.

In such a case, for example, the sound reproduction system is configured as shown in FIG. 12. Note that, in FIG. 12, parts corresponding to those in FIG. 9 are denoted by the same reference numerals, and description thereof will be omitted as appropriate.

The sound reproduction system shown in FIG. 12 includes the sound reproduction device 81 and the speaker 82, and the sound reproduction device 81 has the delay unit 91 to the gain calculation unit 102.

The configuration of the sound reproduction device 81 shown in FIG. 12 is different from the sound reproduction device 81 of FIG. 9 in that the input signal output from the gain adjustment unit 92 is also supplied to the parameter correction unit 97, and the parameter correction value output from the parameter correction unit 97 is supplied to the absolute value calculation unit 100, and the sound reproduction device 81 shown in FIG. 12 has the same configuration as the sound reproduction device 81 of FIG. 9 except for the differences.

The parameter correction unit 97 calculates a measurement displacement value as the parameter correction value on the basis of the input signal supplied from the gain adjustment unit 92 and the current actual measurement value supplied from the AD conversion unit 96, and supplies the measurement displacement value to the absolute value calculation unit 100. That is, here, the parameter correction unit 97 functions as a displacement calculation unit that calculates the displacement of the speaker 82 on the basis of the current actual measurement value that is the actual measurement value of the current flowing through the speaker 82.

Specifically, the parameter correction unit 97 multiplies the input signal by the gain value of the amplification amount of the amplifier 93 to generate the input signal supplied from the amplifier 93 to the speaker 82, and calculates the impedance of the speaker 82 from a voltage value indicated by the obtained input signal and the current actual measurement value. In addition, the parameter correction unit 97 calculates the speed of the movement of the diaphragm of the speaker 82 from the obtained impedance, and calculates the measurement displacement value by integrating the speed.

Note that, here, it is assumed that the amplification amount of the input signal in the amplifier 93 is known. In a case in which the amplification amount of the input signal in the amplifier 93 is not known or the like, the parameter correction unit 97 or the like may measure a voltage value of an output end portion of the amplifier 93, and the impedance may be calculated from the measured voltage value and the current actual measurement value.

The absolute value calculation unit 100 calculates absolute values of the displacement prediction value supplied from the speaker simulator 99 and the measurement displacement values as the parameter correction value supplied from the parameter correction unit 97. In addition, the absolute value calculation unit 100 supplies the larger one of the obtained absolute value of the displacement prediction value and the absolute value of the measurement displacement value to the time constant addition unit 101.

It can be also said that outputting the larger one of the absolute value of the displacement prediction value and the absolute value of the measurement displacement value as the final prediction result of the absolute value of the displacement value of the speaker 82 is correcting the displacement prediction value by the parameter correction value as occasion demands.

In this case, the gain adjustment unit 92 performs the gain adjustment (amplitude control) on the input signal for realizing the suppression control of the excessive amplitude only in a case in which the larger one of the absolute value of the displacement prediction value and the absolute value of the measurement displacement value is larger than the excessive amplitude limit value.

<Description of Reproduction Process>

Figure 13:
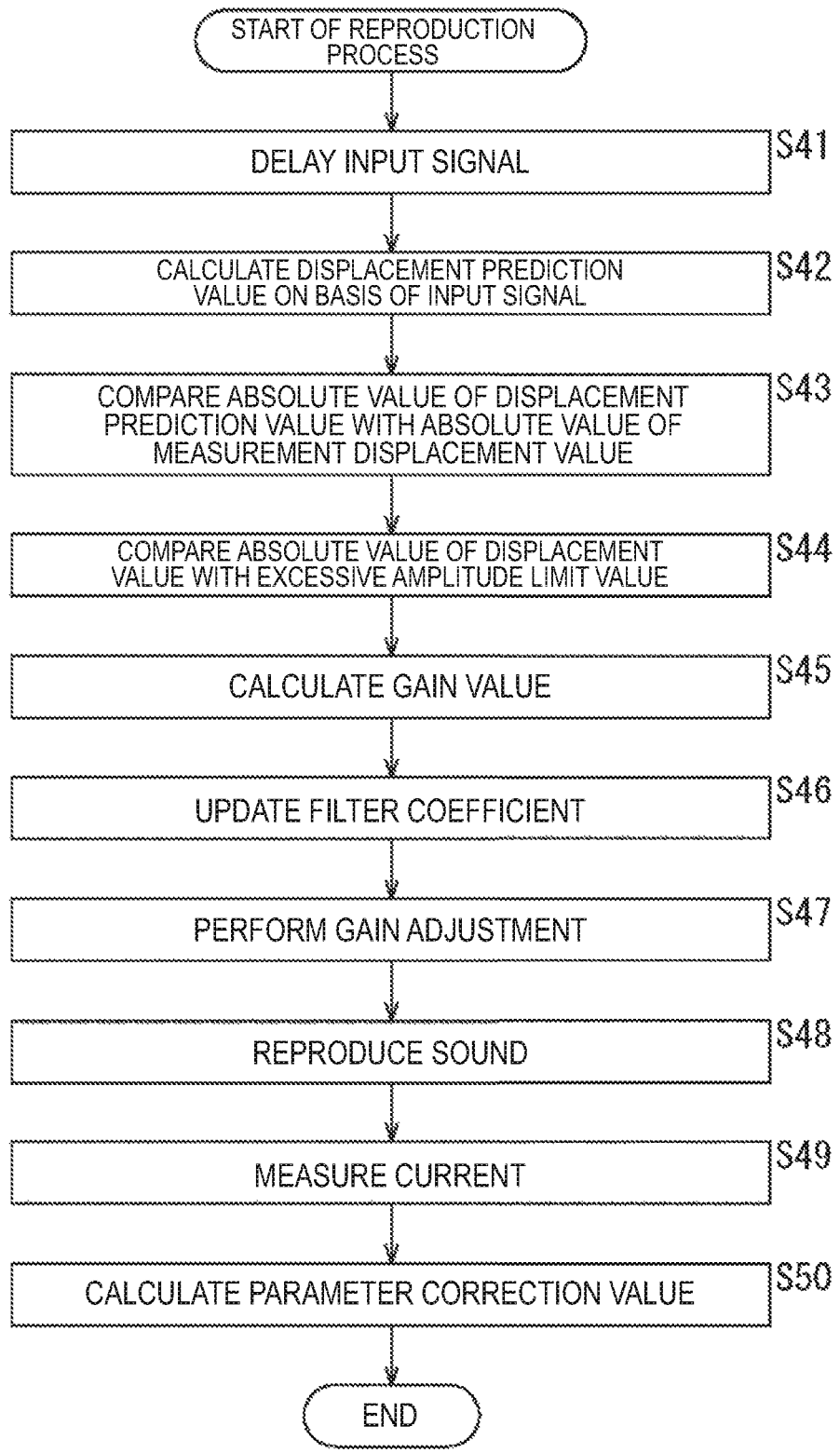
FIG. 13 is a flowchart for explaining a reproduction process.

Next, the reproduction process by the sound reproduction system shown in FIG. 12 will be described with reference to a flowchart of FIG. 13.

Figure 11:
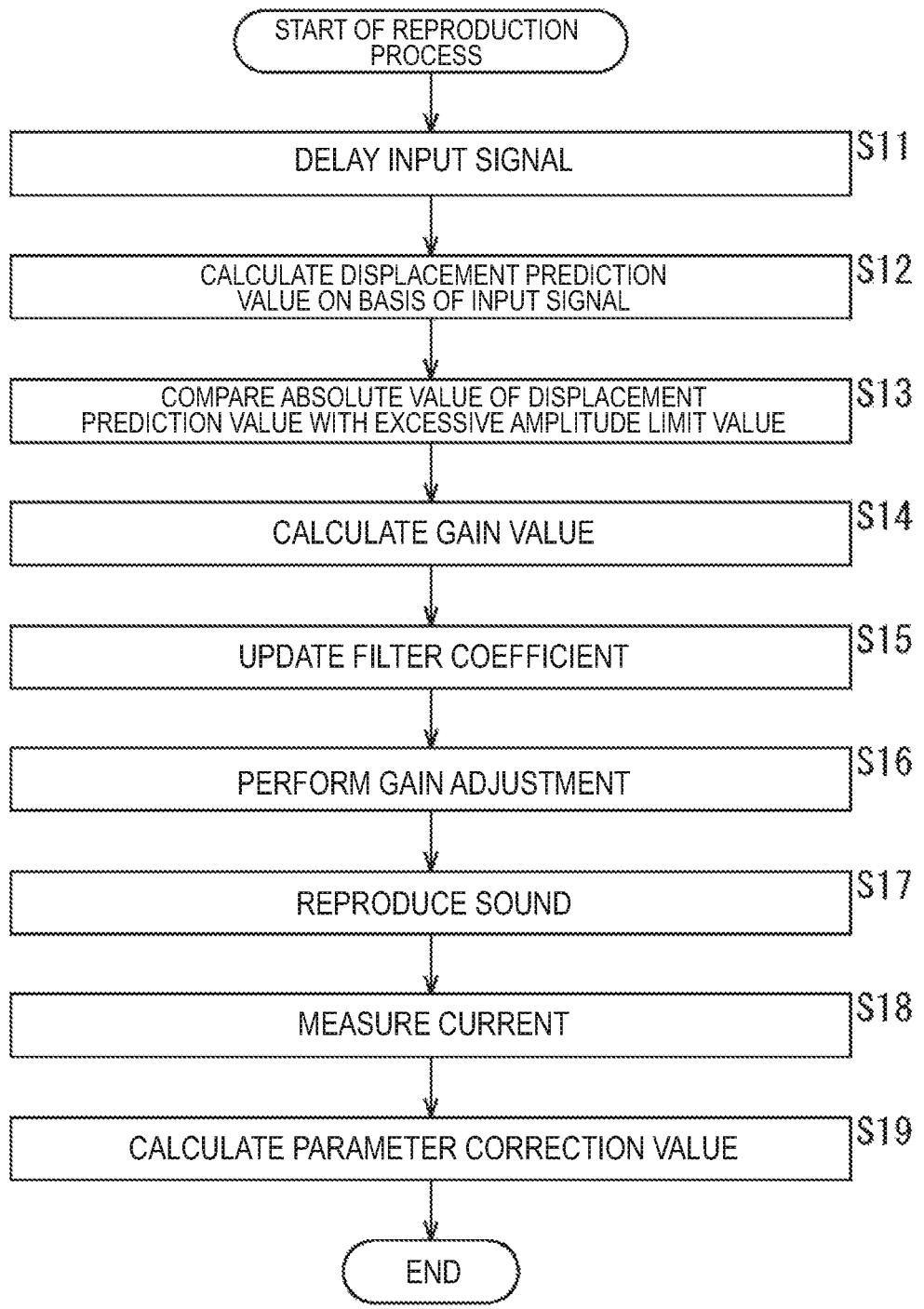
FIG. 11 is a flowchart for explaining a reproduction process.

Note that, since processes of step S41 and step S42 are the same as the processes of step S11 and step S12 of FIG. 11, description thereof will be omitted. However, in step S42, the correction of the TS parameter by the parameter correction value is not performed, and the displacement of the speaker 82 is predicted using the speaker equivalent model. In addition, the displacement prediction value obtained by the prediction is supplied from the speaker simulator 99 to the absolute value calculation unit 100.

In step S43, the absolute value calculation unit 100 compares the absolute value of the displacement prediction value with the absolute value of the measurement displacement value.

That is, the absolute value calculation unit 100 calculates the absolute value of the displacement prediction value supplied from the speaker simulator 99, and calculates the absolute value of the measurement displacement value as the parameter correction value supplied from the parameter correction unit 97. In addition, the absolute value calculation unit 100 compares the absolute value of the displacement prediction value with the absolute value of the measurement displacement value, and supplies larger one to the time constant addition unit 101 as a final prediction result of the absolute value of the displacement value of the speaker 82.

The time constant addition unit 101 adds a time constant to the absolute value of the displacement value of the speaker 82 supplied from the absolute value calculation unit 100, more specifically, the prediction result of the absolute value of the displacement value, and supplies the absolute value of the displacement value to which the time constant is added to the gain calculation unit 102.

In a case in which the time constant is added to the absolute value of the displacement value as described above, processes of step S44 to step S49 are performed thereafter, but such processes are the same as the processes from step S13 to step S18 of FIG. 11, and thus description thereof will be omitted.

However, in step S44, the absolute value of the displacement value output from the time constant addition unit 101 is compared with the excessive amplitude limit value. In addition, in step S47, the input signal output from the gain adjustment unit 92 is supplied not only to the amplifier 93 but also to the parameter correction unit 97.

In step S50, the parameter correction unit 97 calculates the measurement displacement value as the parameter correction value on the basis of the current actual measurement value supplied from the AD conversion unit 96 and the input signal supplied from the gain adjustment unit 92 and supplies the measurement displacement value to the absolute value calculation unit 100, and thus the reproduction process is ended.

The correction parameter calculated as described above is used in the process of step S43 of the reproduction process to be performed next.

As described above, the sound reproduction system calculates the measurement displacement value of the speaker 82 using the actually measured current value, and calculates the gain value for updating (correcting) the filter coefficient using the one having the larger absolute value of the measurement displacement value and the displacement prediction value. Therefore, it is possible to more accurately perform suppression control of the excessive amplitude in consideration of the actual movement of the speaker 82.

Third Embodiment

<Configuration Example of Sound Reproduction System>

Meanwhile, in a case in which physical damage due to the excessive amplitude of the speaker is avoided and larger power is able to be input to the speaker, that is, in a case in which a larger voltage is able to be applied to the speaker, as heat of the voice coil rises, disconnection of the voice coil or the like may occur.

For example, in a case in which power is applied to the voice coil, heat of the voice coil and heat in the vicinity of the voice coil such as the yoke change with respective time constants.

In addition, a value of the direct current resistance of the voice coil depends on a temperature of the voice coil. That is, in a case in which the temperature of the voice coil is Tvc, the direct current resistance of the voice coil when the temperature Tvc of the voice coil is 20 degrees is Re, and the coefficient depending on a material of the voice coil is a, the direct current resistance Re' of the voice coil is obtained by the following formula (1).

$$Re'=(1+\alpha(Tvc-20))\times Re \quad (1)$$

Here, for example, in a case in which the voice coil is a copper conductor, the coefficient α is 0.00393, and therefore, in such a case, the direct current resistance Re' of the voice coil becomes as shown in the following formula (2).

$$Re'=(1+0.00393(Tvc-20))\times Re \quad (2)$$

In addition, for example, in a case in which the direct current resistance Re when the voice coil is 20 degrees is 4Ω and the temperature Tvc of the voice coil reaches 300 degrees, the direct current resistance Re' of the voice coil becomes as shown in the following formula (3).

$$Re'=(1+0.00393(300-20))\times 4.0=8.4016\Omega \quad (3)$$

In formula (3), the direct current resistance Re' of the voice coil is approximately twice the direct current resistance Re when the temperature of the voice coil is 20 degrees.

In the speaker simulator 99 described above, the direct current resistance Re when the voice coil is 20 degrees is used as the direct current resistance of the voice coil that is one of the TS parameters.

However, in a case in which the direct current resistance of the voice coil increases, the current flowing through the speaker 82 is reduced, and thus the displacement value of the speaker 82 is also reduced. Therefore, in a case in which the direct current resistance Re as the TS parameter used in the speaker simulator 99 is a value as it is at a room temperature and a temperature of an actual voice coil becomes near 200 degrees, the difference thereof is not able to be ignored.

Therefore, in the sound reproduction device 81, the current value and the voltage value of the speaker 82 may be measured to calculate the impedance and the direct current resistance of the voice coil as the TS parameter may be corrected on the basis of the impedance.

Figure 14:
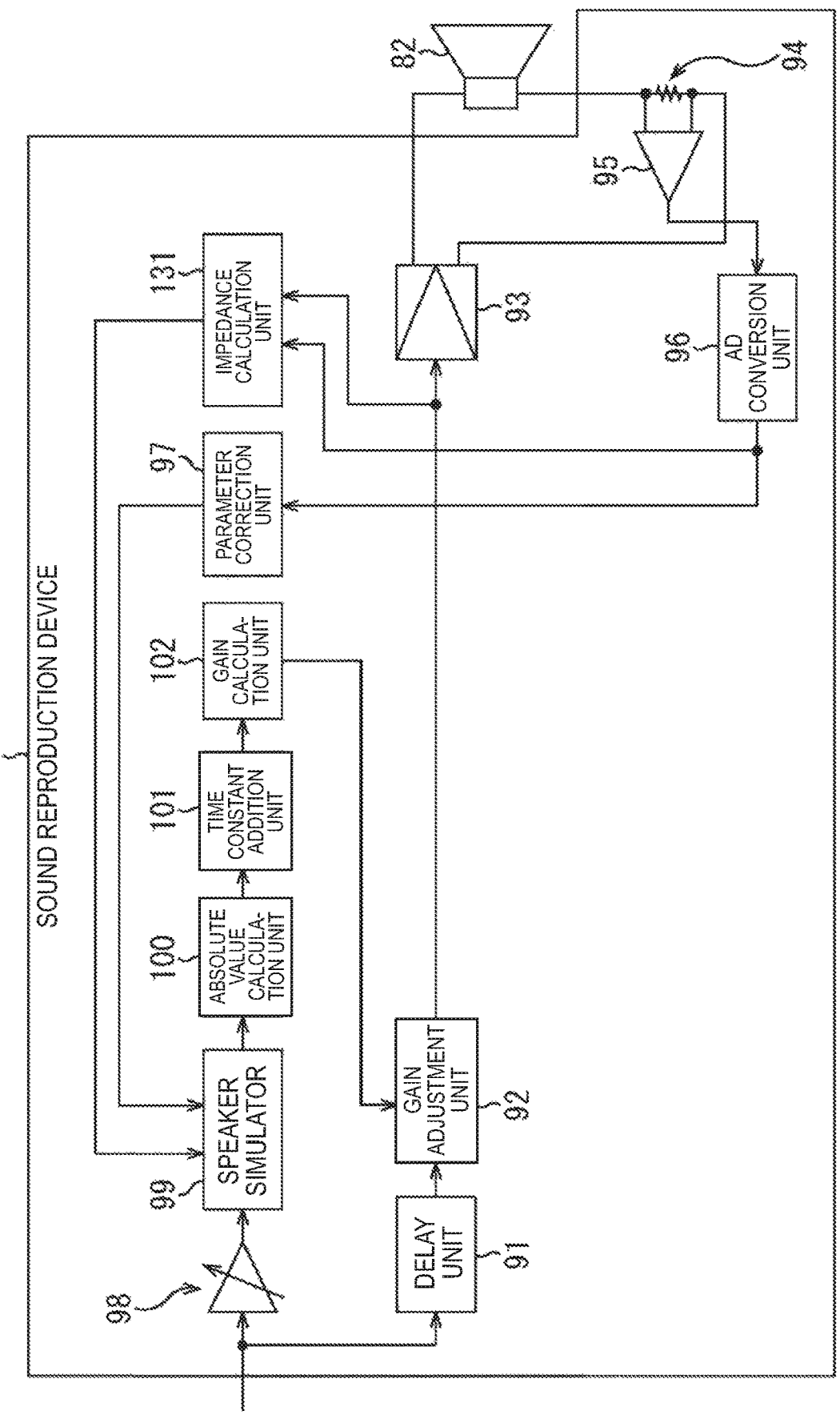
FIG. 14 is a diagram showing another configuration example of the sound reproduction system.

In such a case, for example, the sound reproduction system is configured as shown in FIG. 14. Note that, in FIG. 14, parts corresponding to those in FIG. 9 are denoted by the same reference numerals, and description thereof will be omitted as appropriate.

The sound reproduction system shown in FIG. 14 includes the sound reproduction device 81 and the speaker 82, and the sound reproduction device 81 includes the delay unit 91 to the gain calculation unit 102 and an impedance calculation unit 131.

The configuration of the sound reproduction device 81 shown in FIG. 14 is different from the sound reproduction device 81 of FIG. 9 in that a new impedance calculation unit 131 is provided, and the sound reproduction device 81 shown in FIG. 14 has the same configuration as the sound reproduction device 81 of FIG. 9 except for the differences.

In the example shown in FIG. 14, the input signal output from the gain adjustment unit 92 and the actual current value output from the AD conversion unit 96 are also supplied to the impedance calculation unit 131. Note that, as described above, the current flowing through the speaker 82 may be measured by a current sensor.

The impedance calculation unit 131 calculates the impedance of the speaker 82 on the basis of the input signal supplied from the gain adjustment unit 92 and the current actual measurement value supplied from the AD conversion unit 96 and further calculates the direct current resistance of the voice coil from the impedance.

That is, the impedance calculation unit 131 multiplies the input signal by the gain value of the amplification amount of the amplifier 93, generates the input signal supplied from the amplifier 93 to the speaker 82, and calculates the impedance of the speaker 82 from a voltage value indicated by the obtained input signal and the current actual measurement value. In addition, the impedance calculation unit 131 calculates the direct current resistance of the voice coil of the speaker 82 from the obtained impedance.

In the following description, the direct current resistance of the voice coil calculated by the impedance calculation unit 131 is also particularly referred to as a direct current resistance Re'. Note that, similarly to a case of the parameter correction unit 97 described with reference to FIG. 12, in a case in which the amplification amount of the input signal in the amplifier 93 is not known or the like, the voltage value of the output end portion of the amplifier 93 is measured, and the impedance may be calculated from the measured voltage value and the current actual measurement value.

The impedance calculation unit 131 supplies the direct current resistance Re' of the voice coil obtained as described above to the speaker simulator 99. In the speaker simulator 99, the displacement prediction value is calculated using the direct current resistance Re' supplied from the impedance calculation unit 131 as the direct current resistance Re of the voice coil as the TS parameter. That is, in the speaker simulator 99, the direct current resistance Re of the voice coil of the speaker 82 as the TS parameter is corrected on the basis of the direct current resistance Re', and the displacement prediction value is calculated.

In addition, here, an example in which the impedance calculation unit 131 is further provided with respect to the sound reproduction device 81 shown in FIG. 9 has been described, but the impedance calculation unit 131 may further be provided with respect to the sound reproduction device 81 shown in FIG. 12.

<Description of Reproduction Process>

Figure 15:
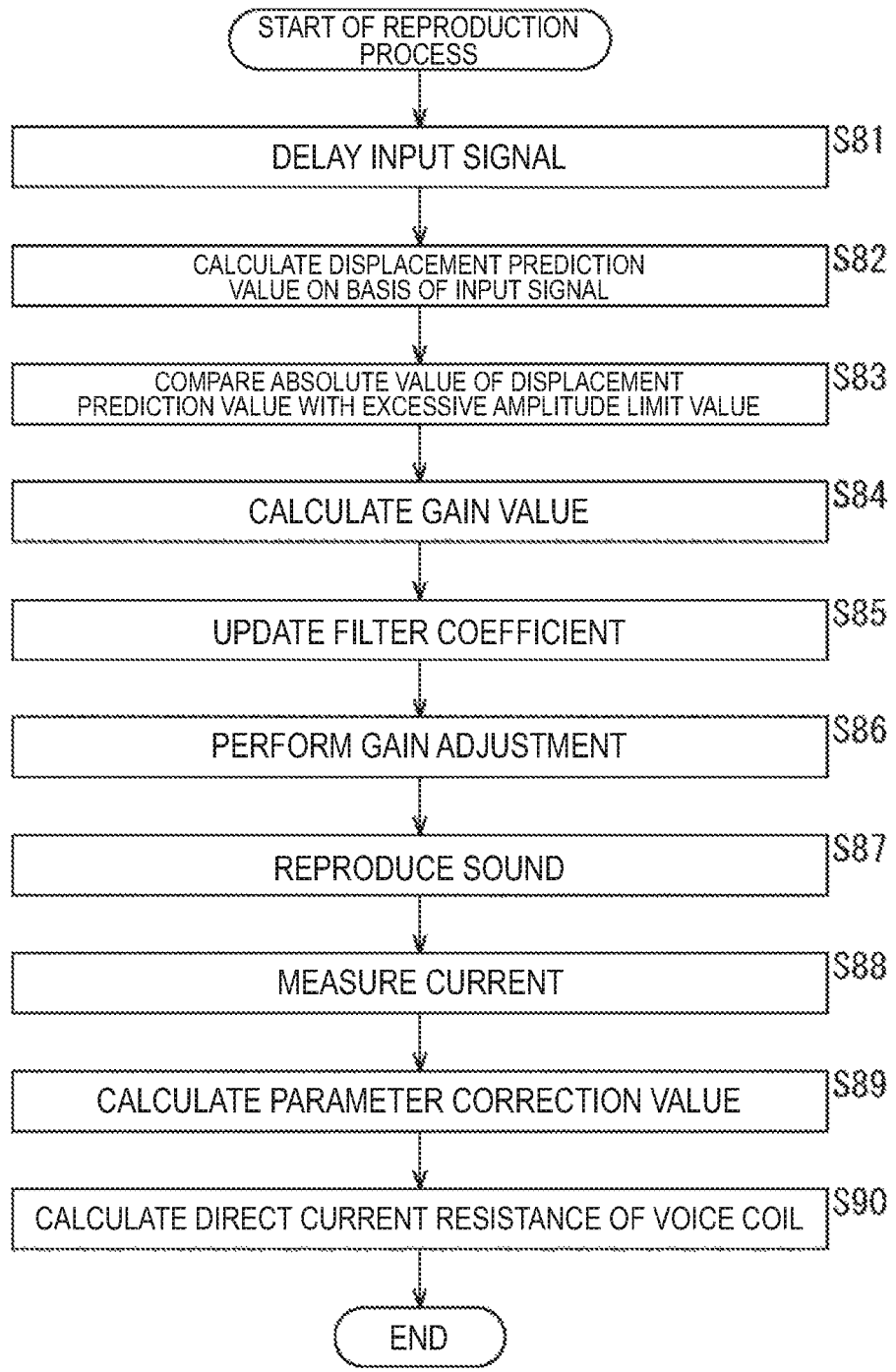
FIG. 15 is a flowchart for explaining a reproduction process.

Next, the reproduction process by the sound reproduction system shown in FIG. 14 will be described with reference to a flowchart of FIG. 15.

Note that, since the processes of steps S81 to S89 are the same as the processes of step S11 to step S19 of FIG. 11, description thereof will be omitted.

However, in step S82, the speaker simulator 99 corrects the TS parameter by using the parameter correction value supplied from the parameter correction unit 97 and the direct current resistance Re' supplied from the impedance calculation unit 131. In particular, the direct current resistance Re' is used to correct the direct current resistance Re of the voice coil as the TS parameter.

In step S90, the impedance calculation unit 131 calculates the impedance of the speaker 82 on the basis of the input signal supplied from the gain adjustment unit 92 and the current actual measurement value supplied from the AD conversion unit 96, and calculates the direct current resistance Re' of the voice coil from such an impedance. In addition, the impedance calculation unit 131 supplies the obtained direct current resistance Re' to the speaker simulator 99, and the reproduction process is ended.

The direct current resistance Re' obtained as described above is used in the process of step S82 of the reproduction process to be performed next.

As described above, the sound reproduction system calculates the direct current resistance value of the voice coil of the speaker 82 using the actually measured current value, and corrects the TS parameter at the time of calculating the displacement prediction value on the basis of the obtained direct current resistance value. Therefore, it is possible to more accurately perform suppression control of the excessive amplitude in consideration of the actual temperature of the voice coil.

Fourth Embodiment

<Configuration Example of Sound Reproduction System>

Furthermore, the temperature of the voice coil may be obtained from the calculated direct current resistance value of the voice coil of the speaker 82, and the gain adjustment of the input signal may be performed on the basis of the obtained temperature.

Figure 16:
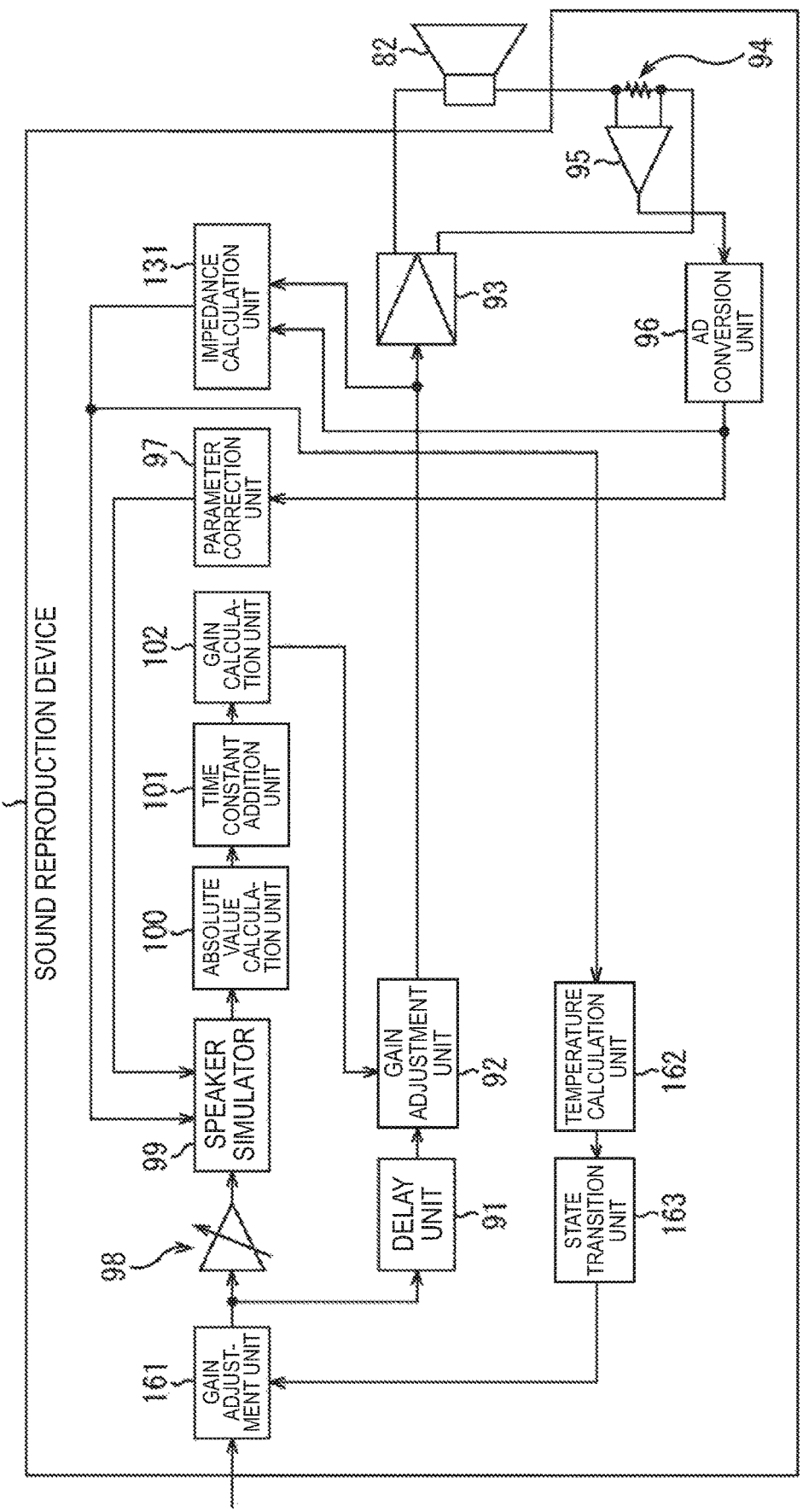
FIG. 16 is a diagram showing another configuration example of the sound reproduction system.

In such a case, for example, the sound reproduction system is configured as shown in FIG. 16. Note that, in FIG. 16, parts corresponding to those in FIG. 14 are denoted by the same reference numerals, and description thereof will be omitted as appropriate.

The sound reproduction system shown in FIG. 16 includes the sound reproduction device 81 and the speaker 82, and the sound reproduction device 81 includes the delay unit 91 to the gain calculation unit 102, the impedance calculation unit 131, a gain adjustment unit 161, a temperature calculation unit 162, and a state transition unit 163.

The configuration of the sound reproduction device 81 shown in FIG. 16 is different from the sound reproduction device 81 of FIG. 14 in that a new gain adjustment unit 161 to the state transition unit 163 are provided, and the sound reproduction device 81 shown in FIG. 16 has the same configuration as the sound reproduction device 81 of FIG. 14 except for the differences.

In the example shown in FIG. 16, the direct current resistance Re' output from the impedance calculation unit 131 is also supplied to the temperature calculation unit 162.

The temperature calculation unit 162 calculates the temperature Tvc of the voice coil using, for example, the above-described formula (1), on the basis of the direct current resistance Re' supplied from the impedance calculation unit 131, and supplies the calculated temperature Tvc of the voice coil to the state transition unit 163.

The state transition unit 163 transits a state related to the temperature of the voice coil on the basis of the temperature of the voice coil supplied from the temperature calculation unit 162, and determines the gain value.

That is, in the state transition unit 163, a temperature range that is able to be obtained by the voice coil is divided into several ranges, and the gain value is determined in advance with respect to such temperature ranges. The state transition unit 163 specifies a temperature range including the supplied temperature Tvc of the voice coil and selects a predetermined gain value with respect to the specified temperature range. The state transition unit 163 supplies the gain value selected as described above to the gain adjustment unit 161.

The gain adjustment unit 161 performs the gain adjustment for suppressing the temperature rise of the voice coil on the input signal supplied from the outside on the basis of the gain value supplied from the state transition unit 163, and supplies the input signal obtained from a result of the gain adjustment to the amplification unit 98 and the delay unit 91. In other words, the gain adjustment unit 161 performs temperature control of the voice coil by performing the gain adjustment.

Here, in the gain adjustment in the gain adjustment unit 161, for example, a process of suppressing the signal level of the input signal by dynamic range compression (DRC), dynamic EQ, or the like is performed so that the temperature of the voice coil is suppressed to 200 degrees or less.

As described above, the gain adjustment unit 161 functions as a temperature control unit that performs the gain adjustment for suppressing the temperature rise of the voice coil with respect to the input signal according to the temperature of the voice coil of the speaker 82, that is, the amplitude control (temperature control).

A temperature change of the voice coil is a gradual change compared to the change of the input signal itself. Therefore, in the gain adjustment for the temperature control of the voice coil, update of the gain value used for the gain adjustment is not frequently performed and is gradually switched. Therefore, in the state transition unit 163, one gain value is determined for each temperature range having a certain width.

<Description of Reproduction Process>

Figure 17:
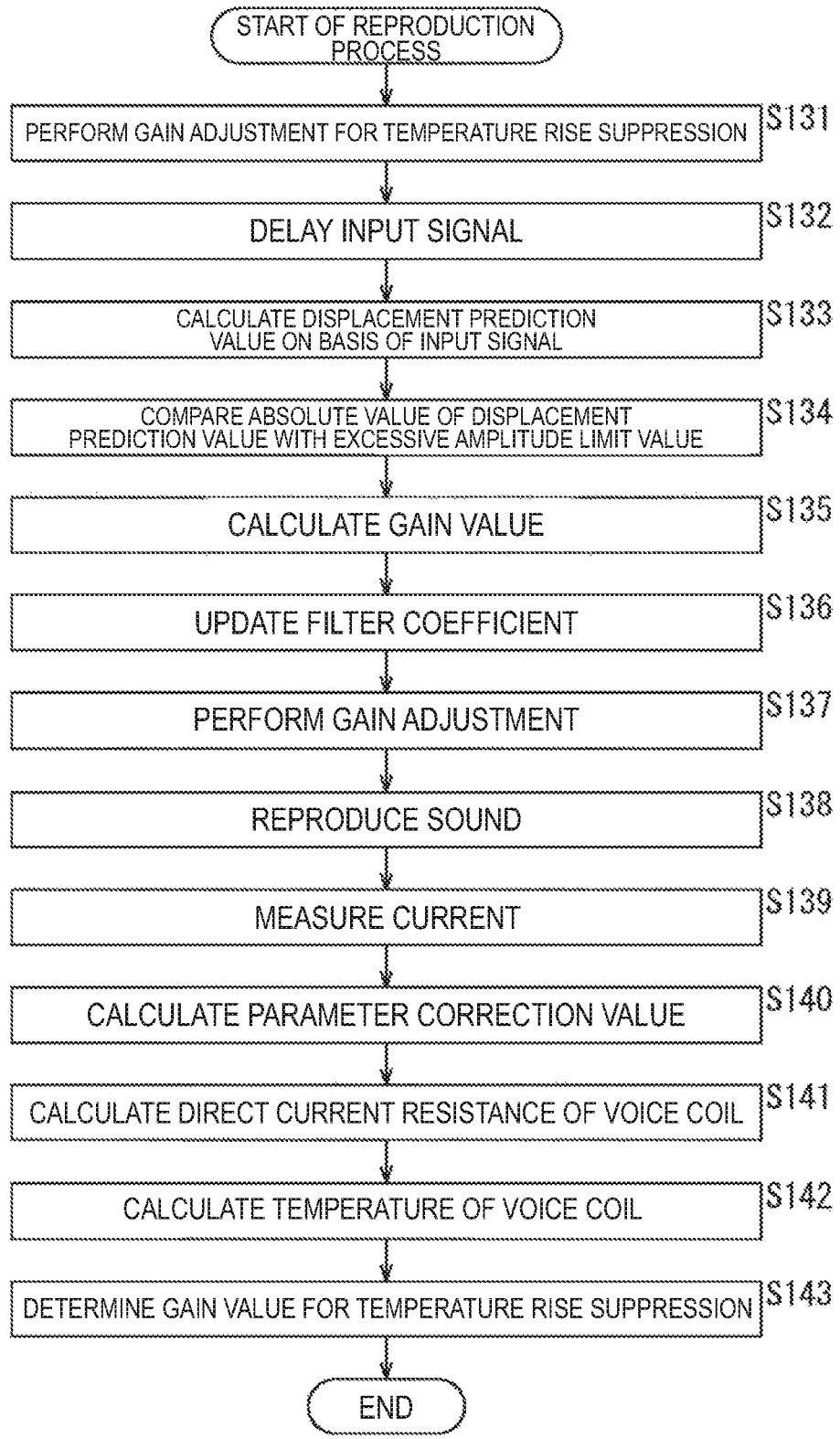
FIG. 17 is a flowchart for explaining a reproduction process.

Next, the reproduction process by the sound reproduction system shown in FIG. 16 will be described with reference to a flowchart of FIG. 17.

In step S131, the gain adjustment unit 161 performs the gain adjustment for suppressing the temperature rise of the voice coil on the input signal supplied from the outside on the basis of the gain value supplied from the state transition unit 163, and supplies the input signal obtained from the result of the gain adjustment to the amplification unit 98 and the delay unit 91.

After the gain adjustment for suppressing the temperature rise is performed on the input signal, processes of step S132 to step S141 are performed. Since such processes are similarly to the processes of step S81 to step S90 of FIG. 15, description thereof will be omitted.

However, in step S141, the calculated direct current resistance Re' of the voice coil is supplied from the impedance calculation unit 131 to the speaker simulator 99 and the temperature calculation unit 162.

In step S142, the temperature calculation unit 162 calculates the temperature of the voice coil from the above-described formula (1), on the basis of the direct current resistance Re' supplied from the impedance calculation unit 131 and a predetermined temperature, that is, the direct current resistance of the voice coil that is in 20 degrees, and supplies the calculated temperature of the voice coil to the state transition unit 163.

In step S143, the state transition unit 163 determines the gain value for suppressing the temperature rise of the voice coil on the basis of the temperature of the voice coil supplied from the temperature calculation unit 162, and supplies the determined gain value to the gain adjustment unit 161.

As described above, in a case in which the gain value corresponding to the temperature of the voice coil is output, the reproduction process is ended. Here, the gain value determined in the process of step S143 is used in the process of step S131 of the reproduction process to be performed next.

As described above, the sound reproduction system calculates the temperature of the voice coil of the speaker 82 using the actually measured current value, and performs the gain adjustment for suppressing the temperature rise on the input signal by using the gain value corresponding to the obtained temperature. Therefore, it is possible to suppress the temperature rise of the voice coil.

Note that, in the present technology, of course, it is possible to appropriately combine the above-described embodiments.

<Example of Computer Configuration>

Incidentally, the above-described series of processes may be performed by hardware or may be performed by software. When the series of processes are performed by software, a program forming the software is installed into a computer. Examples of the computer include a computer that is incorporated in dedicated hardware and a general-purpose computer that can perform various types of function by installing various types of program.

FIG. 18 is a block diagram illustrating a configuration example of the hardware of a computer that performs the above-described series of processes with a program.

In the computer, a central processing unit (CPU) 501, read only memory (ROM) 502, and random access memory (RAM) 503 are mutually connected by a bus 504.

Further, an input/output interface 505 is connected to the bus 504. Connected to the input/output interface 505 are an input unit 506, an output unit 507, a recording unit 508, a communication unit 509, and a drive 510.

The input unit 506 includes a keyboard, a mouse, a microphone, an image sensor, and the like. The output unit 507 includes a display, a speaker, and the like. The recording unit 508 includes a hard disk, a non-volatile memory, and the like. The communication unit 509 includes a network interface, and the like. The drive 510 drives a removable recording medium 511 such as a magnetic disk, an optical disc, a magneto-optical disk, and a semiconductor memory.

In the computer configured as described above, the CPU 501 loads a program that is recorded, for example, in the recording unit 508 onto the RAM 503 via the input/output interface 505 and the bus 504, and executes the program, thereby performing the above-described series of processes.

For example, programs to be executed by the computer (CPU 501) can be recorded and provided in the removable recording medium 511, which is a packaged medium or the like. In addition, programs can be provided via a wired or wireless transmission medium such as a local area network, the Internet, and digital satellite broadcasting.

In the computer, by mounting the removable recording medium 511 onto the drive 510, programs can be installed into the recording unit 508 via the input/output interface 505. Programs can also be received by the communication unit 509 via a wired or wireless transmission medium, and installed into the recording unit 508. In addition, programs can be installed in advance into the ROM 502 or the recording unit 508.

Note that a program executed by the computer may be a program in which processes are chronologically carried out in a time series in the order described herein or may be a program in which processes are carried out in parallel or at necessary timing, such as when the processes are called.

In addition, embodiments of the present disclosure are not limited to the above-described embodiments, and various alterations may occur insofar as they are within the scope of the present disclosure.

For example, the present technology can adopt a configuration of cloud computing, in which a plurality of devices shares a single function via a network and perform processes in collaboration.

Furthermore, each step in the above-described flowcharts can be executed by a single device or shared and executed by a plurality of devices.

In addition, when a single step includes a plurality of processes, the plurality of processes included in the single step can be executed by a single device or shared and executed by a plurality of devices.

The advantageous effects described herein are not limited, but merely examples. Any other advantageous effects may also be attained.

Additionally, the present technology may also be configured as below.

(1)

A sound processing device including:

a prediction value calculation unit that calculates a prediction value of a displacement of a speaker according to an input signal supplied to the speaker on the basis of an equivalent model of the speaker; and an amplitude control unit that performs amplitude control on the input signal in a case in which the prediction value is greater than a predetermined threshold value.

(2)

The sound processing device according to (1), in which the prediction value calculation unit corrects a parameter of the equivalent model according to an actual measurement value of a current flowing through the speaker.

(3)

The sound processing device according to (2), in which the prediction value calculation unit corrects mechanical system compliance as the parameter.

(4)

The sound processing device according to (2) or (3), in which the prediction value calculation unit corrects a direct current resistance of a voice coil of the speaker as the parameter.

(5)

The sound processing device according to (4), further including:

a temperature calculation unit that calculates a temperature of the voice coil on the basis of the direct current resistance; and a temperature control unit that performs temperature control for suppressing a temperature increase of the voice coil with respect to the input signal according to the temperature of the voice coil.

(6)

The sound processing device according to any one of (1) to (5), further including:

a displacement calculation unit that calculates the displacement of the speaker on the basis of an actual measurement value of a current flowing through the speaker, in which, in a case in which a larger one of the displacement calculated by the displacement calculation unit and the prediction value is greater than the threshold value, the amplitude control unit performs amplitude control on the input signal.

(7)

The sound processing device according to any one of (1) to (6), further including:

a delay unit that delays the input signal by a predetermined time and supplies the delayed signal to the amplitude control unit.

(8)

The sound processing device according to any one of (1) to (7), in which the prediction value calculation unit calculates the prediction value on the basis of the equivalent model determined by a plurality of parameters including a force coefficient that changes nonlinearly with respect to the displacement of the speaker and mechanical system compliance.

(9)

The sound processing device according to any one of (1) to (8), in which the amplitude control unit performs amplitude control on the input signal on the basis of a gain value determined from the prediction value and the threshold value.

(10)

A sound processing method including the steps of:

calculating a prediction value of a displacement of a speaker according to an input signal supplied to the speaker on the basis of an equivalent model of the speaker; and performing amplitude control on the input signal in a case in which the prediction value is greater than a predetermined threshold value.

(11)

A program that causes a computer to execute a process including the steps of:

calculating a prediction value of a displacement of a speaker according to an input signal supplied to the speaker on the basis of an equivalent model of the speaker; and performing amplitude control on the input signal in a case in which the prediction value is greater than a predetermined threshold value.

REFERENCE SIGNS LIST 81 sound reproduction device
82 speaker
91 delay unit
92 gain adjustment unit
95 differential amplifier
97 parameter correction unit
99 speaker simulator
102 gain calculation unit
131 impedance calculation unit
161 gain adjustment unit
162 temperature calculation unit
163 state transition unit

The invention claimed is:

1. A sound processing device, comprising:
circuitry configured to:
calculate a prediction value of a displacement of a speaker, wherein the prediction value is calculated based on an input signal supplied to the speaker and an equivalent model of the speaker; and
control an amplitude of the input signal based on the prediction value greater than a threshold value, wherein
the amplitude of the input signal is controlled based on a gain value, and
the gain value is a ratio of the threshold value to the prediction value.

2. The sound processing device according to claim 1, wherein the circuitry is configured to correct a parameter of the equivalent model based on an actual measurement value of a current that flows through the speaker.

3. The sound processing device according to claim 2, wherein the circuitry is further configured to correct a mechanical system compliance as the parameter.

4. The sound processing device according to claim 2, wherein the circuitry is further configured to correct a direct current resistance of a voice coil of the speaker as the parameter.

5. The sound processing device according to claim 4, wherein the circuitry is further configured to:
calculate a temperature of the voice coil based on the direct current resistance; and
control the temperature to suppress a temperature increase of the voice coil with respect to the input signal.

6. The sound processing device according to claim 1, wherein the circuitry is further configured to:
calculate the displacement of the speaker based on an actual measurement value of a current that flows through the speaker; and
control the amplitude of the input signal based on larger one of the calculated displacement or the prediction value that is greater than the threshold value.

7. The sound processing device according to claim 1, wherein the circuitry is further configured to:
delay the input signal by a determined time; and
supply the delayed input signal.

8. The sound processing device according to claim 1, wherein
the circuitry is further configured to calculate the prediction value based on the equivalent model determined by a plurality of parameters, and
the plurality of parameters includes
a force coefficient that changes nonlinearly with respect to the displacement of the speaker and
a mechanical system compliance.

9. A sound processing method, comprising:
calculating a prediction value of a displacement of a speaker, wherein the prediction value is calculated based on an input signal supplied to the speaker and an equivalent model of the speaker; and
controlling an amplitude of the input signal based on the prediction value greater than a threshold value, wherein
the amplitude of the input signal is controlled based on a gain value, and
the gain value is a ratio of the threshold value to the prediction value.

10. A non-transitory computer-readable medium having stored thereon, computer-executable instructions, which when executed by a computer, cause the computer to execute operations, the operations comprising:
- calculating a prediction value of a displacement of a speaker, wherein the prediction value is calculated based on an input signal supplied to the speaker and an equivalent model of the speaker; and
- controlling an amplitude of the input signal based on the prediction value greater than a threshold value, wherein the amplitude of the input signal is controlled based on a gain value, and
- the gain value is a ratio of the threshold value to the prediction value.

* * * * *